United States Patent
Root et al.

(10) Patent No.: US 8,994,390 B2
(45) Date of Patent: *Mar. 31, 2015

(54) TEST SYSTEMS WITH A PROBE APPARATUS AND INDEX MECHANISM

(75) Inventors: Bryan J. Root, Apple Valley, MN (US); William A. Funk, Eagan, MN (US); John L. Dunklee, Tigard, OR (US)

(73) Assignee: Celadon Systems, Inc., Apple Valley, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/131,080

(22) PCT Filed: Jul. 6, 2012

(86) PCT No.: PCT/US2012/045705
§ 371 (c)(1),
(2), (4) Date: Apr. 11, 2014

(87) PCT Pub. No.: WO2013/006771
PCT Pub. Date: Jan. 10, 2013

(65) Prior Publication Data
US 2014/0225636 A1 Aug. 14, 2014

Related U.S. Application Data

(60) Provisional application No. 61/504,907, filed on Jul. 6, 2011, provisional application No. 61/592,760, filed on Jan. 31, 2012.

(51) Int. Cl.
*G01R 1/04* (2006.01)
*G01R 31/28* (2006.01)
*G01R 1/073* (2006.01)

(52) U.S. Cl.
CPC .......... *G01R 1/0466* (2013.01); *G01R 31/2889* (2013.01); *G01R 1/073* (2013.01)
USPC ............ 324/750.16; 324/754.07; 324/754.13; 324/754.15; 324/756.03; 324/756.05; 324/762.01

(58) Field of Classification Search
CPC .......... G01R 31/2886; G01R 31/2889; G01R 31/26; G01R 1/067; G01R 1/06705; G01R 1/06711; G01R 1/073
USPC ............. 324/750.16, 750.24, 750.25, 754.07, 324/754.12, 754.13, 754.15, 756.03, 324/756.05, 762.01–762.09
See application file for complete search history.

(56) References Cited

U.S. PATENT DOCUMENTS 3,866,119 A * 2/1975 Ardezzone et al. ...... 324/755.11
5,355,079 A 10/1994 Evans et al.
(Continued)

FOREIGN PATENT DOCUMENTS

CN 1662820 8/2005
JP 59072146 A * 4/1984 .............. H01L 21/66
(Continued)

OTHER PUBLICATIONS

International Search Report for international application No. PCT/US2012/045705, dated Jan. 24, 2013 (3 pages).
(Continued)

*Primary Examiner* — Huy Q Phan
*Assistant Examiner* — James Split
(74) *Attorney, Agent, or Firm* — Hamre, Schumann, Mueller & Larson, P.C.

(57) ABSTRACT

A probe apparatus has probe wires with a contact pattern on one side. The contact pattern is for contacting a respective contact pattern on another test equipment or component, such as a circuit board. The probe wires have tips that probe a device desired for testing. Signals are transmitted through the probe wires from the probe card, for example, through a circuit board to other diagnostic equipment. The contact of the probe card with the circuit board allows signals to be transferred through the probe wires to the other diagnostic equipment. On another side of the probe card is a connector structure. The connector structure includes a retainer that can allow the probe card to be replaced from a test system, such as allowing it to be connected and disconnected from a holder.

13 Claims, 33 Drawing Sheets

(56) References Cited

U.S. PATENT DOCUMENTS

| | | | |
|---|---|---|---|
| 5,640,100 A * | 6/1997 | Yamagata et al. | 324/750.22 |
| 5,872,459 A | 2/1999 | Pasiecznik, Jr. | |
| 6,034,533 A * | 3/2000 | Tervo et al. | 324/756.03 |
| 6,114,869 A | 9/2000 | Williams et al. | |
| 6,201,402 B1 | 3/2001 | Root | |
| 6,586,954 B2 | 7/2003 | Root | |
| 6,707,311 B2 | 3/2004 | Hohenwarter | |
| 6,963,207 B2 | 11/2005 | Root et al. | |
| 6,975,128 B1 | 12/2005 | Root et al. | |
| 6,992,495 B2 | 1/2006 | Root et al. | |
| 7,626,404 B2 * | 12/2009 | Root et al. | 324/750.19 |
| 7,728,609 B2 * | 6/2010 | Root et al. | 324/755.01 |
| 7,791,359 B2 | 9/2010 | Ku et al. | |
| 2004/0119463 A1 | 6/2004 | Lou et al. | |
| 2006/0071679 A1 | 4/2006 | Gibbs et al. | |
| 2007/0159192 A1 * | 7/2007 | Hasegawa et al. | 324/754 |
| 2008/0164900 A1 | 7/2008 | Ku et al. | |
| 2009/0219042 A1 | 9/2009 | Sasaki et al. | |
| 2009/0295416 A1 | 12/2009 | Root et al. | |
| 2010/0164518 A1 | 7/2010 | Yamada et al. | |
| 2010/0205699 A1 * | 8/2010 | Tachizaki et al. | 850/47 |
| 2011/0204912 A1 | 8/2011 | Root et al. | |

FOREIGN PATENT DOCUMENTS

| | | | |
|---|---|---|---|
| JP | 02119235 A * | 5/1990 | H01L 21/66 |
| JP | 09-064125 | 3/1997 | |
| JP | 2001-165956 | 6/2001 | |
| JP | 2003-322664 | 11/2003 | |
| KR | 10-0303039 | 12/2001 | |
| TW | 200411793 | 7/2004 | |

OTHER PUBLICATIONS

Written Opinion for international application No. PCT/2012/045705, dated Jan. 24, 2013 (5 pages).

International Search Report and Written Opinion for International Application No. PCT/US2012/045701, dated Jan. 3, 2013, 7 pgs.

International Search Report and Written Opinion for International Application No. PCT/US2012/045704, dated Jan. 28, 2013, 9 pgs.

Office Action for Chinese application No. 201280039075.X, issued Sep. 29, 2014 (10 pages, including machine translation).

* cited by examiner

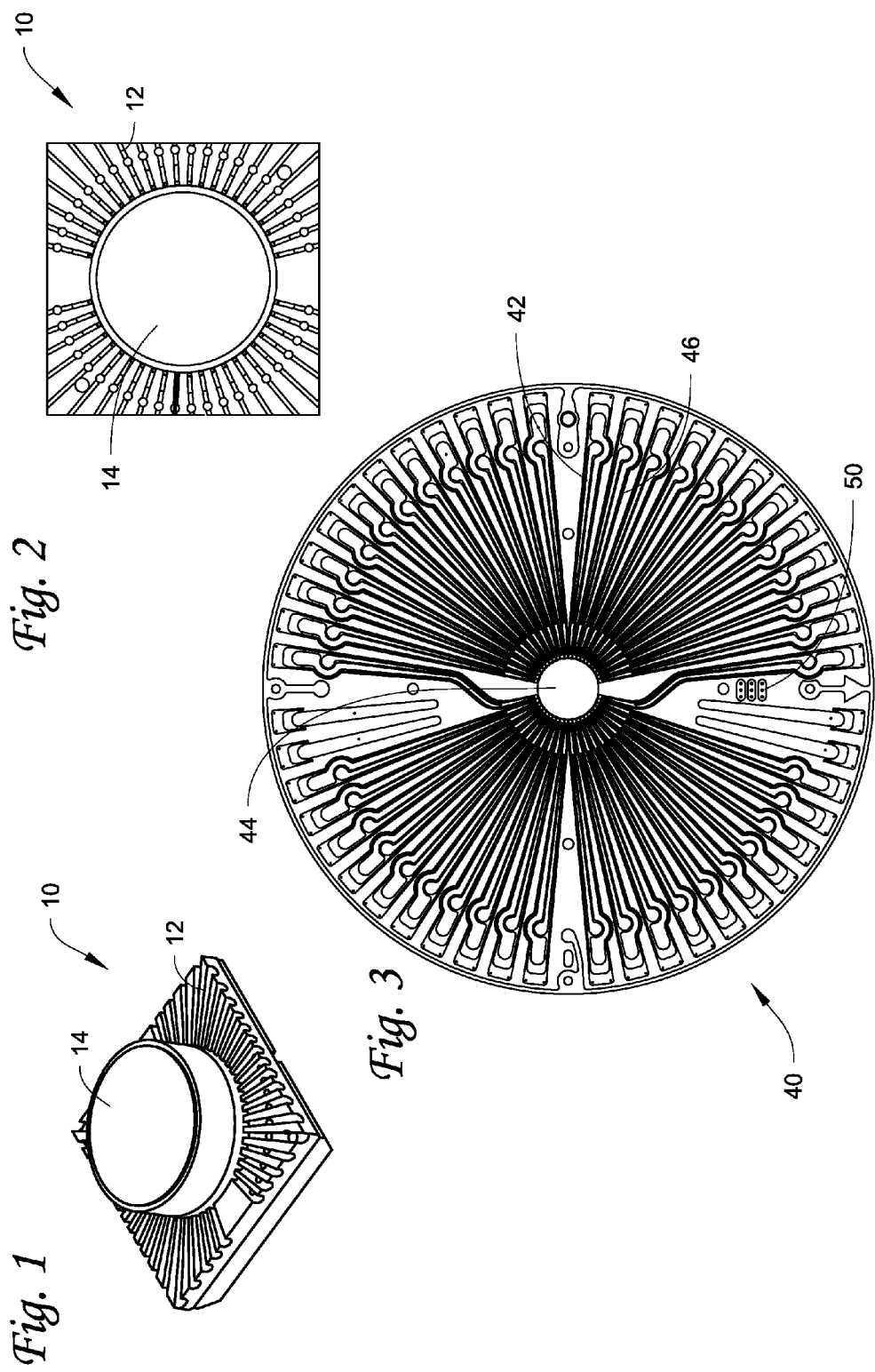

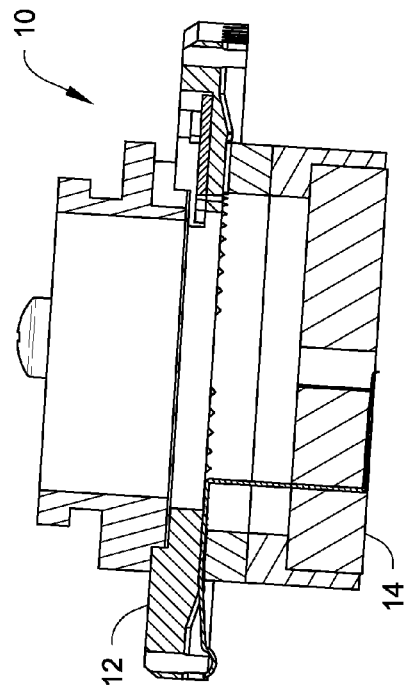
Fig. 2B
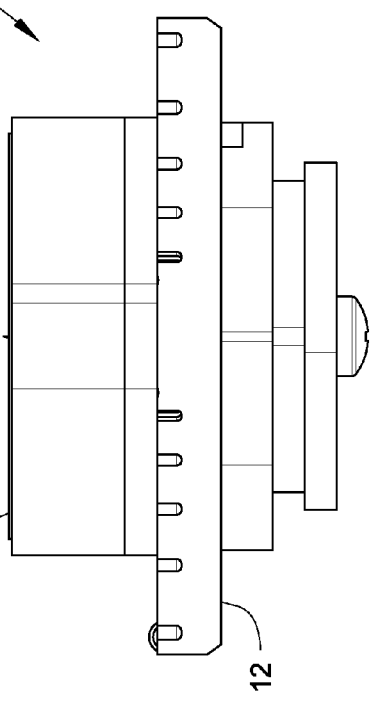
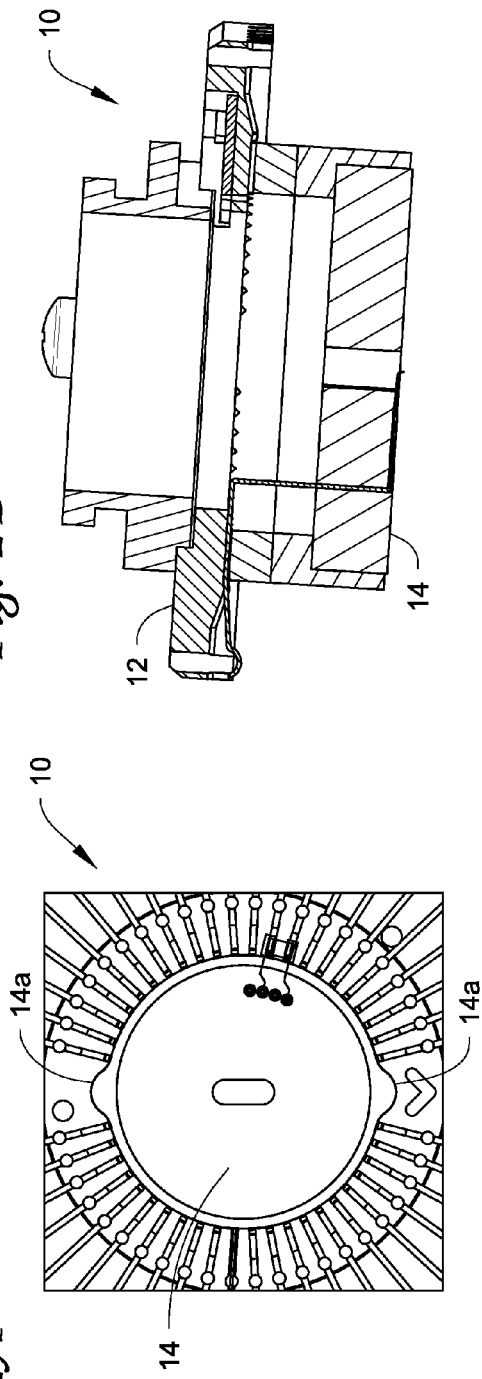
Fig. 2A
Fig. 2C

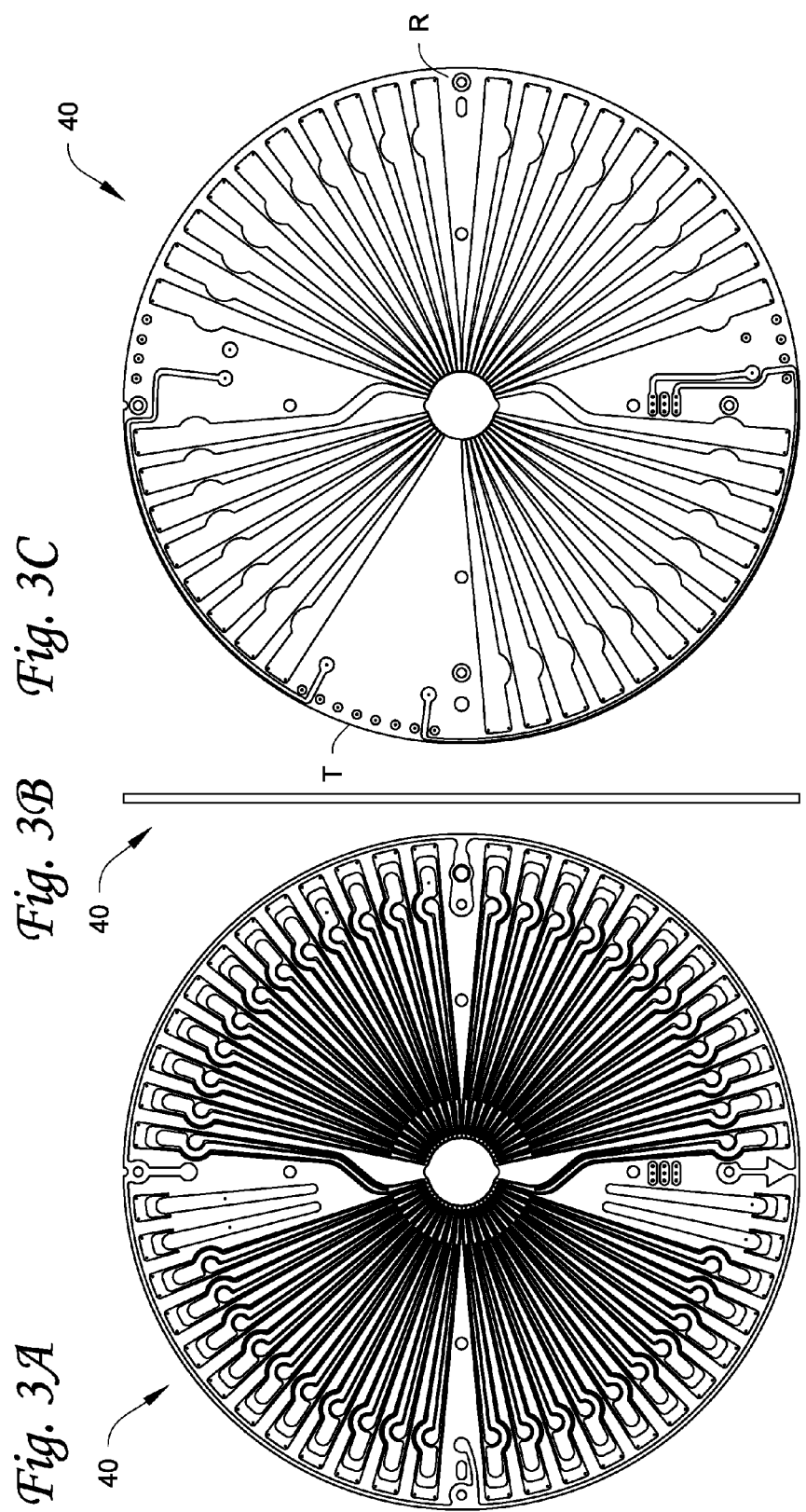

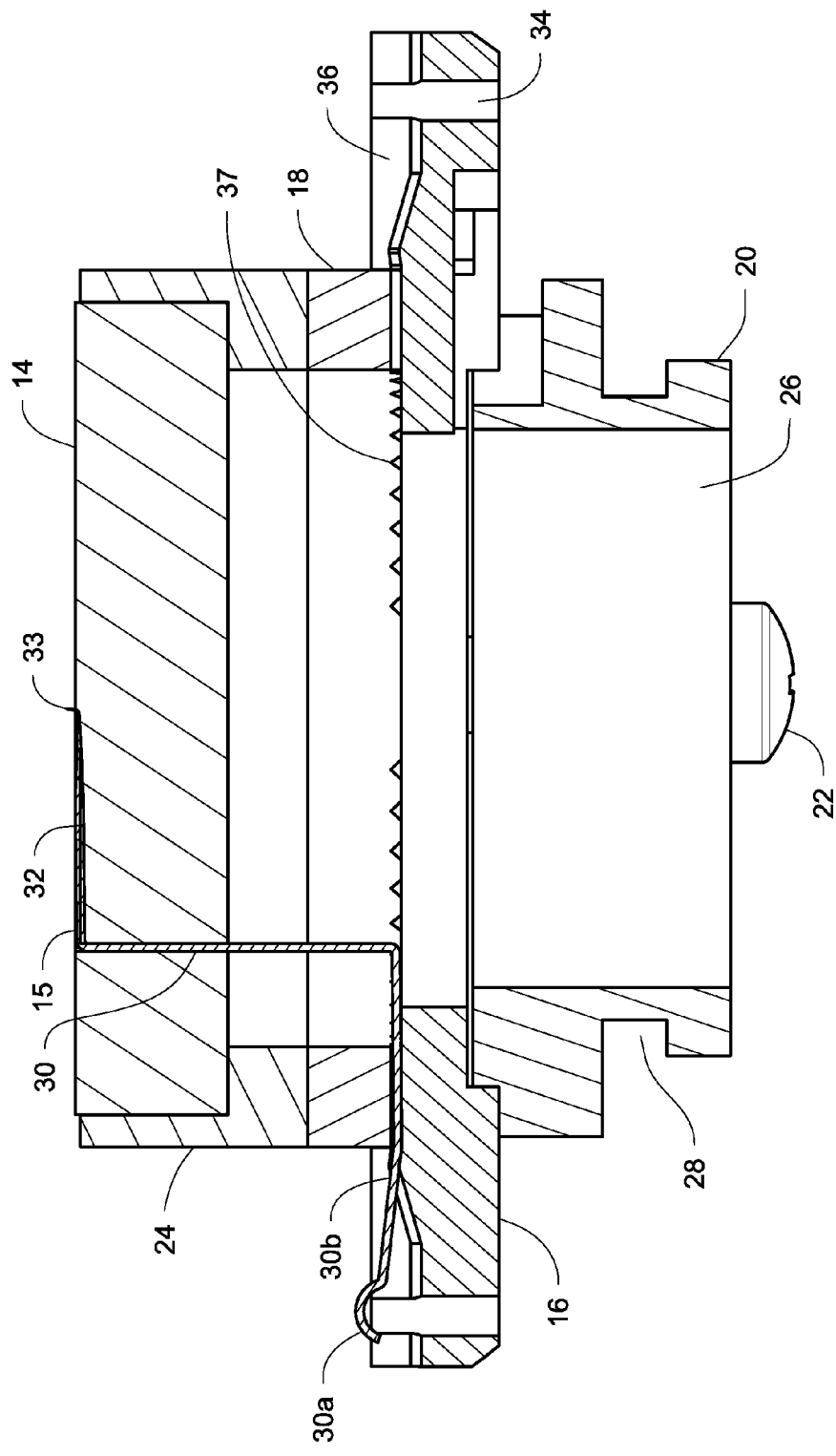

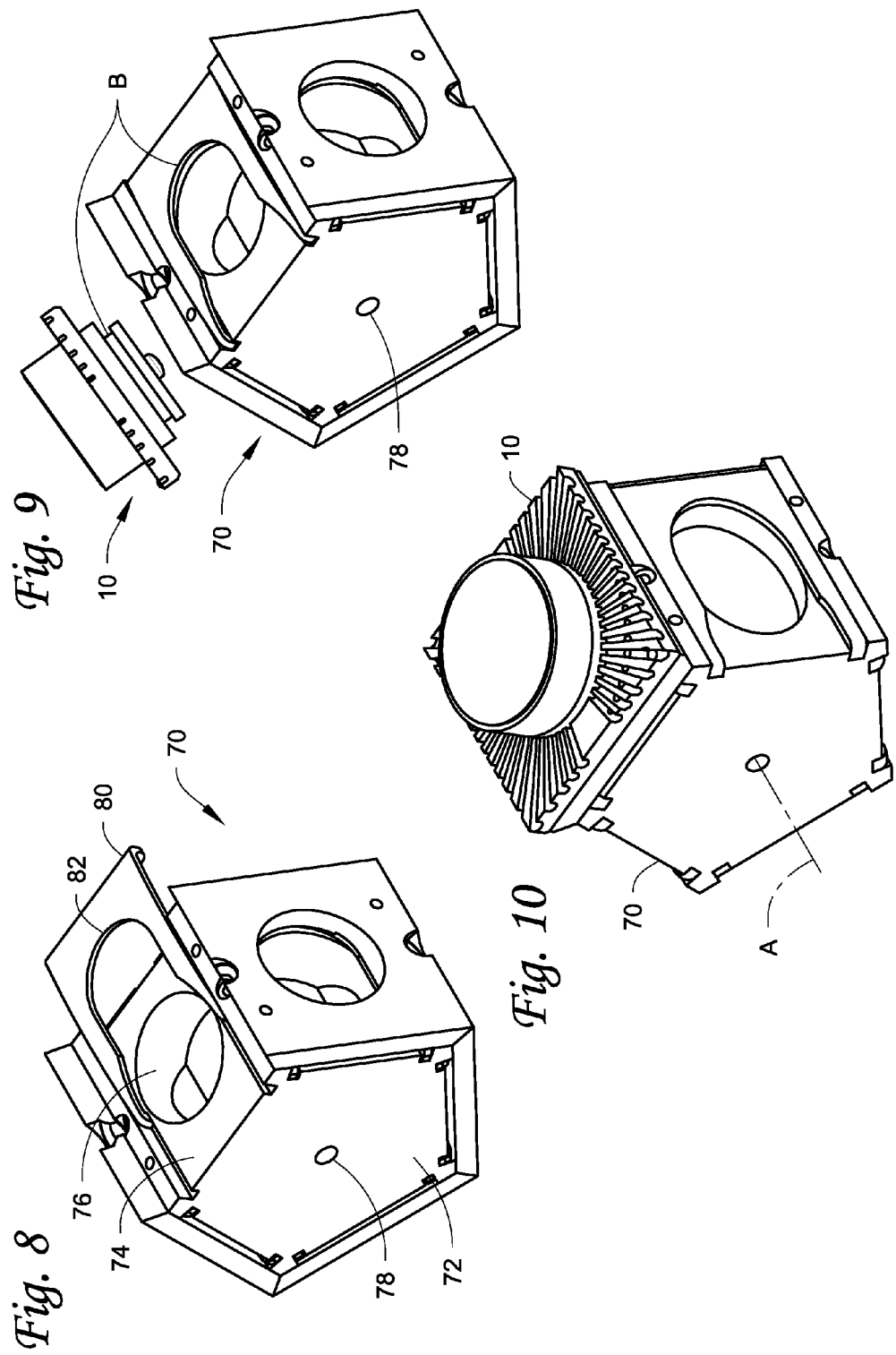

TEST SYSTEMS WITH A PROBE APPARATUS AND INDEX MECHANISM

This application claims the benefit of U.S. Provisional Application No. 61/504,907 filed on Jul. 6, 2011 and titled TEST APPARATUS HAVING PROBE CARD AND CONNECTOR MECHANISM, the entirety of which is incorporated by reference herewith. This application also claims the benefit of U.S. Provisional Application No. 61/592,760 filed on Jan. 31, 2012 and titled TEST APPARATUS WITH A PROBE APPARATUS AND INDEX MECHANISM, the entirety of which is incorporated by reference herewith.

FIELD

This disclosure relates generally to test equipment and systems, particularly for testing a semiconductor device. More particularly, the disclosure herein relates to systems and apparatuses that have a probe card that can be used with other test equipment for electrically probing a semiconductor device, such as a semiconductor wafer or a micro-electrical-mechanical systems (MEMS) device.

BACKGROUND

Wafer probing and testing, for example in the semiconductor industry, could be made more efficient and accurate. As the semiconductor industry grows and devices become ever smaller, the equipment required to test the wafers has become more complex and expensive. Complex and expensive equipment must be utilized efficiently in order to maximize the return on investment, and complexities of testing requirements mean that the equipment must have diagnostic tests performed efficiently as well. Probe cards used to probe the wafers deteriorate electrically and mechanically with use as probes wear out and as the probes pick up particulate. Currently to replace the probe cards as they wear out, the prober and tester must be stopped while the probe card is replaced. Replacing the probe card takes several minutes—time that could be used testing wafers. The act of replacing the wafer can also change the mechanical fit of the wafer/probe card/prober/test head system resulting in different electrical results. The post card change verification can more than double the down time.

SUMMARY

It would be useful, for example, to reduce the need to stop test equipment to replace a probe card and to improve utilization and electrical performance in wafer testing. Test systems, apparatuses, and equipment are described that are useful, for example, in systems to test a semiconductor device. More particularly, a probe apparatus is described that can be used to electrically probe a semiconductor device, such as a semiconductor wafer or MEMS device.

Generally, the probe apparatus is structured as a probe card that has a contact pattern of probe wires on one side. In some embodiments, the probe wires may be gold plated. The contact pattern is for contacting a respective contact pattern on another test equipment or component, such as a circuit board. The probe wires also include tips that probe a device desired for testing, such as a device under test (DUT) for example in semiconductor testing. Signals are transmitted through the probe wires from the probe card, through the contact of the probe card insert or core and the circuit board, and through the circuit board to other diagnostic equipment. The contact of the probe card with the circuit board allows signals to be transferred through the probe wires to the other diagnostic equipment.

Also on the probe card is a connector structure, for example on another side of the apparatus. The connector structure allows the probe card to be connected or disconnected from a holder.

In one embodiment, the connector structure includes a socket mount that can be connected, for example to a holder such as by connecting the socket mount of the connector structure to a connector structure on the holder. In some examples, the connector structure on the holder is a mating connector, such as ball mount, which can allow slight movement, such as tilting movements, of the probe card to facilitate good contact, for example to a circuit board.

In one embodiment, the holder allows for a probe card to be replaced with another probe card, such as for example, another probe card with a different contact pattern or another probe card that may be a replacement for a worn out or used probe card. In some embodiments, the holder has multiple probe cards connected to it, and is configured to allow for interchanging among the probe cards connected to the holder, such as for changing a probe card between testing. In some embodiments, the holder is part of a system of components used to test devices, where the holder is able to manipulate and position the probe card as needed.

With further reference to the probe card, in one embodiment a probe card has a wire guide, a probe tile connected with the wire guide, and a plurality of probe wires supported by the wire guide and probe tile. Each probe wire is positioned through the wire guide and the probe tile. Each wire includes a probe tip extending through the probe tile. The probe tips are configured to probe a device, such as a semiconductor wafer. Each wire may also include a signal transmitting portion and a guard portion exposed from the wire guide. The signal transmitting portions and the guard portions form a contact pattern. This contact pattern is for contacting a signal contact and guard contact pattern on another equipment, such as a circuit board.

In one embodiment, the probe tips and the contact pattern of the probe card are on one side of the probe card. On the other side of the probe card is a connector structure. The connector structure is configured to allow the probe card to be connected and disconnected to a holder. In one embodiment, the connector structure is a retainer member that has a retention slot.

In one embodiment, a probe card such as described above is incorporated as part of a test system, apparatus, or equipment, where the probe card has a contact pattern that matches a contact pattern on another test equipment or component, such as for example a circuit board or motherboard. The probe card described herein also can be part of an overall system for testing devices, such as semiconductor devices. For example, the connector structure of the probe card allows it to be connected to a holder, where the holder is part of a system of components for testing devices and is able to manipulate and position the probe card as needed. For example: a traditional wafer prober machine.

In one embodiment, a method of probing devices under test comprises positioning a holder into a probe position, positioning a probe needle array onto a device under test using the holder, probing the device under test using the probe needle array, and transmitting signals through the probe needle array to a test equipment.

BRIEF DESCRIPTION OF THE DRAWINGS

The drawings, which are not necessarily drawn to scale, illustrate generally by way of example, but not by way of limitation, various embodiments discussed in this application.

FIG. 1 is a bottom perspective view of one embodiment of a probe apparatus, such as a probe card.

FIG. 2 is a bottom view of the probe apparatus from FIG. 1.

FIG. 2A is another bottom view of the probe apparatus of FIG. 1.

FIG. 2B is a sectional view of the probe apparatus of FIG. 1.

FIG. 2C is a side view of the probe apparatus of FIG. 1.

FIG. 3 is a top view of one embodiment of a circuit board.

FIG. 3A is another top view of the circuit board of FIG. 3.

FIG. 3B is a side view of the circuit board of FIG. 3.

FIG. 3C is another top view of the circuit board of FIG. 3.

FIG. 6 is a sectional view of the probe apparatus of FIG. 1.

FIG. 8 is a perspective view of one embodiment of a holder.

FIG. 9 is a perspective view of the holder of FIG. 8 prior to connection with a probe card.

FIG. 10 is a perspective view of the holder of FIG. 8 shown connected to a probe card.

DETAILED DESCRIPTION

Figure 4:
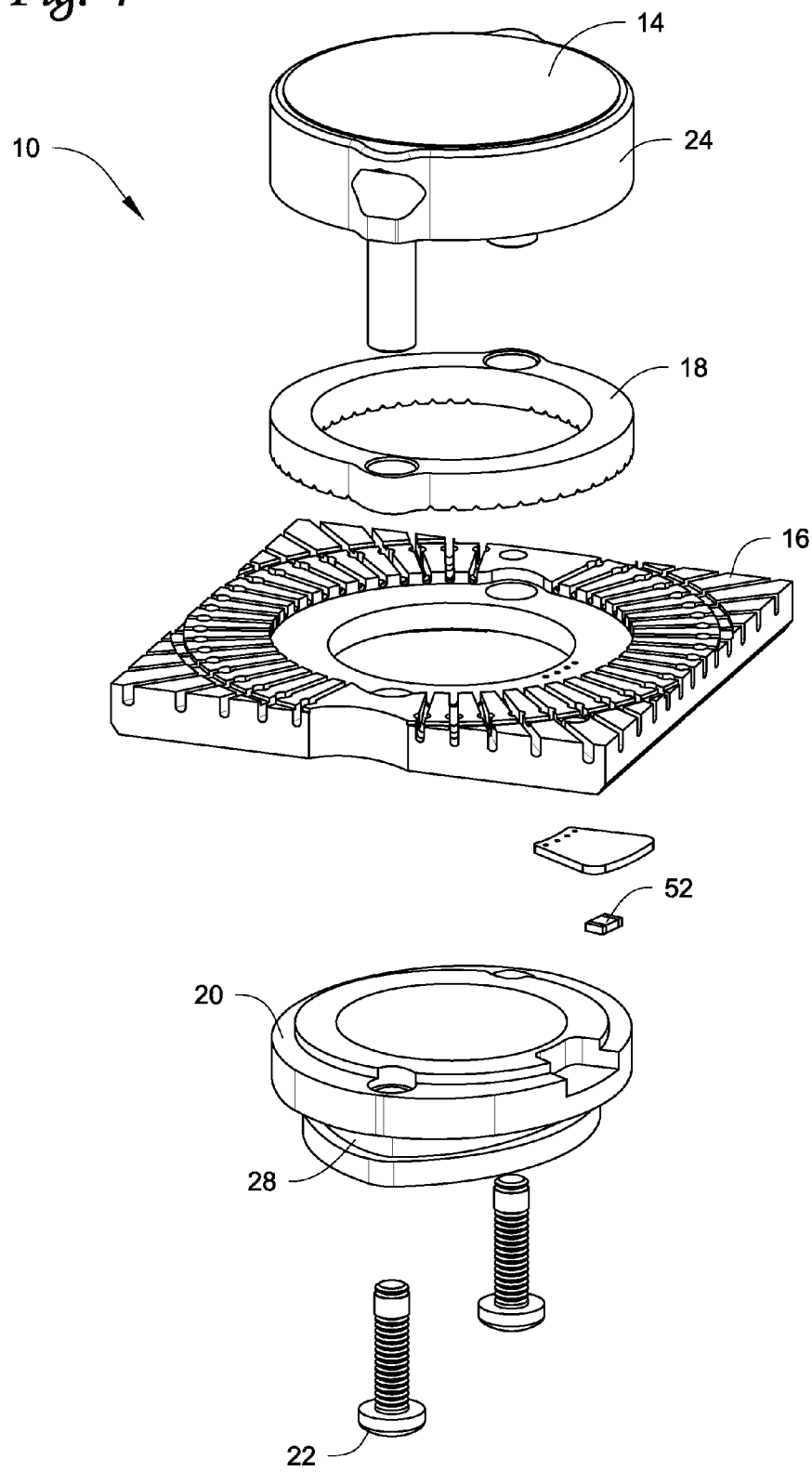
FIG. 4 is an exploded view of the probe apparatus of FIG. 1.

FIGS. 1-7 show one embodiment of test equipment that can be used in a system to test devices, such as for example semiconductor devices, including but not limited to semiconductor wafers or other MEMS devices. Particularly, test systems, apparatuses, and equipment are described. Generally, a circuit board and a probe card can be used to electrically probe a semiconductor device, such as a semiconductor wafer. The probe card contacts the circuit board. The probe card has probe wires that can probe the device to be tested and transmit signals from the probe card to the circuit board. The circuit board transmits signals from the probe card for example to other testing equipment.

FIGS. 1, 2, and 2A-C show one embodiment of a probe card 10. The probe card 10 has a wire guide 16. A probe tile 14 is connected with the wire guide 16 (shown in FIG. 6). The wire guide 16 provides a groove pattern 12 for probe wires to be configured into a contact pattern for example, for contacting a circuit board 40 (described further below). As shown in FIGS. 4-6A, a clamp 18 is used to secure probe wires within the groove pattern 12 of the wire guide 16. The clamp 18 has grooves 37 that correspond to each of the grooves of the pattern 12 on the wire guide 16. As shown, the grooves of the wire guide 16 may have a radiused surface, which can further facilitate alignment and eliminate mismatch of the contact between the probe card 10 and the circuit board 40.

A plurality of probe wires 30 are supported by the wire guide 16, clamp 18, and probe tile 14. For ease of illustration, one probe wire 30 is shown (see FIGS. 6 and 6A). However, it will be appreciated that a probe wire 30 may reside within each of the grooves of the groove pattern 12 provided by the guide 16 and grooves 37 of the clamp 18.

Figure 6A:
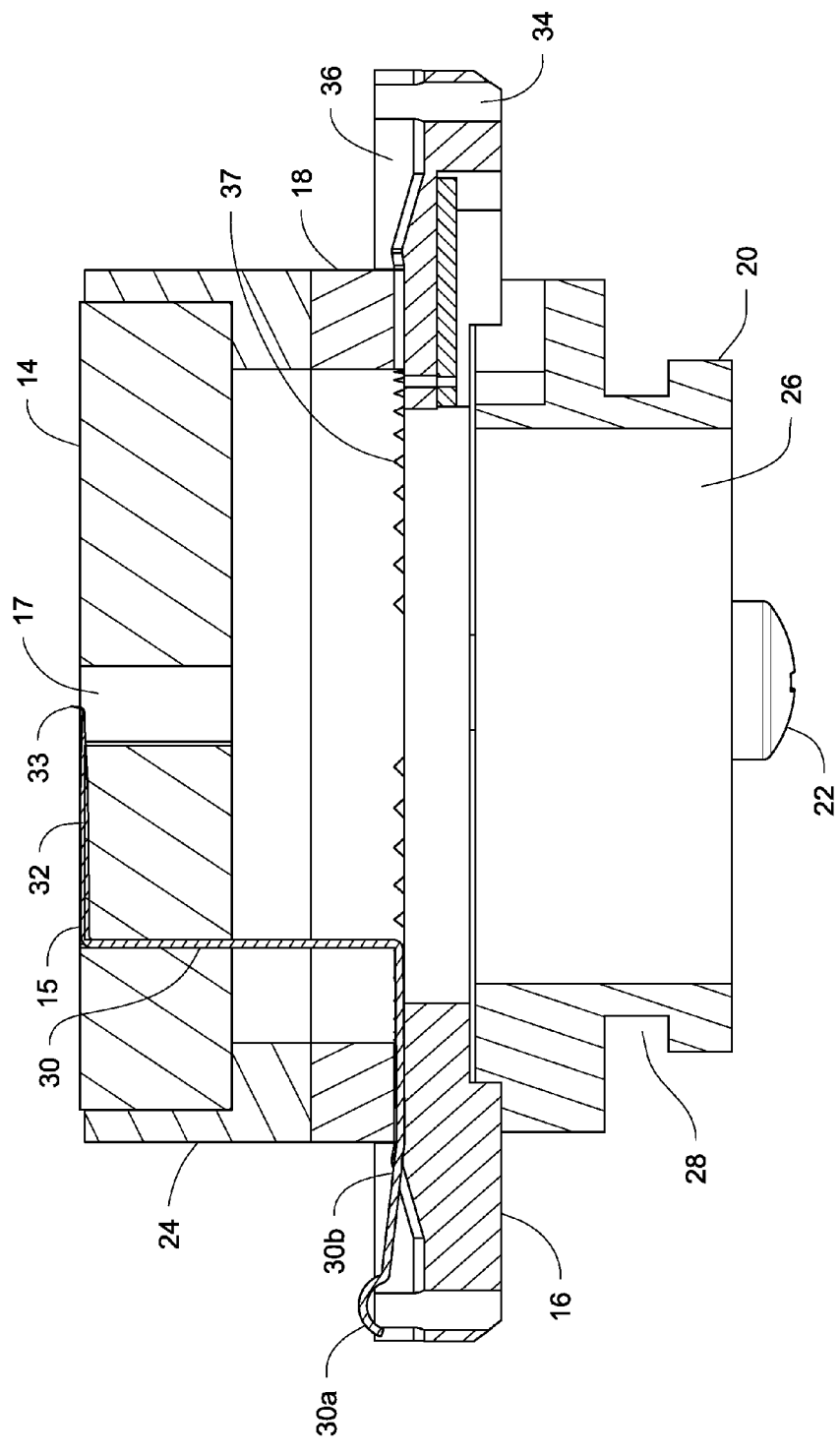
FIG. 6A is another sectional view of the probe apparatus of FIG. 6.

With further reference to FIGS. 6 and 6A, each probe wire (see probe wire 30) would be positioned through grooves of the wire guide 16 and clamp 18, and a channel 15 of the probe tile 14. As shown, the grooves 37 of the clamp 18 in one embodiment are smaller relative to the groove pattern 12 of the wire guide, which can allow the clamp 18 to limit movement of the probe wires 30 after assembly. The channel 15 allows the probe wire 30 to be inserted into and through the probe tile 14 to an opening 17.

The probe wires 30 provide the probing function of the probe card 10. Each probe wire 30 would include a probe needle 32 with a probe tip 33 that extends through the probe tile 14. For example, the probe needles 32 and tips 33 may be disposed toward the center of the probe tile 14, where the tips are exposed from the probe tile 14 generally at the center of the probe tile 14, such as at opening 17. It will be appreciated that the tips can be appropriately arranged in various configurations and various needle/tip arrays so as to accommodate a device to be tested. The channel 15 provides an inlet and outlet for each probe wire 30, and allows the probe wires 30 to extend from the wire guide 16 into the probe tile 14, and then out of the probe tile 14 to an exposed or open center area of the probe card 10. For ease of illustration, one probe wire 30 is shown as going through one channel 15 of the probe tile 14 (see e.g. FIGS. 6 and 6A). However, several channels 15 may be present in the probe tile 14, such as for each groove of the wire guide 16 and clamp 18, so that multiple probe wires 30 go through the probe tile 14.

Each probe wire 30 also includes a signal transmitting portion 30a and an optional guard portion 30b exposed from the wire guide 16. The signal transmitting portions 30a and the guard portions 30b form a contact pattern on one side of the probe card 10 within the groove pattern 12 of the wire guide 16. The contact pattern of the signal transmitting portions 30a and the guard portions 30b, matches the contact pattern of the circuit board 40 (further described below).

With further reference to the wire guide 16, the groove pattern 12 includes holes 34. The wire guide also includes a clearance 36 at each groove, which allows for the probe wire 30 for example to bend enough to contact the circuit board 40. The holes 34 allow for forming the contact of the probe wire 30 with the circuit board, such as after installation, and allow for viewing the probe wire 30 so that confirmation can be made that a respective wire 30 is in a correct position and that proper contact has been formed. In one embodiment, the hole 34 can allow access to the probe wire 30, for example so that it can be manipulated through the hole. In some examples, each groove of the wire guide 16 can have the clearance 36.

Further description and illustration of a wire guide, probe tile, and probe wires is in pending U.S. application Ser. No. 13/010,234, filed Jan. 20, 2011, the entirety of which is incorporated by reference herein. In one embodiment, the probe tile 14 is constructed of a different material than the wire guide 16, clamp 18, and retainer member 20 (further described below). For example, the probe tile 14 is a dielectric material and may be composed of a ceramic material for example. In some embodiments, the retainer is a stainless steel or other suitably stiff material. It will be appreciated that a high temperature plastic may be employed for example for the wire guide and clamp. It will further be appreciated that other plastics or other suitably stiff materials may be employed for example if testing is conducted around room temperature or not high temperatures that would require a more resistant material.

Figure 5:
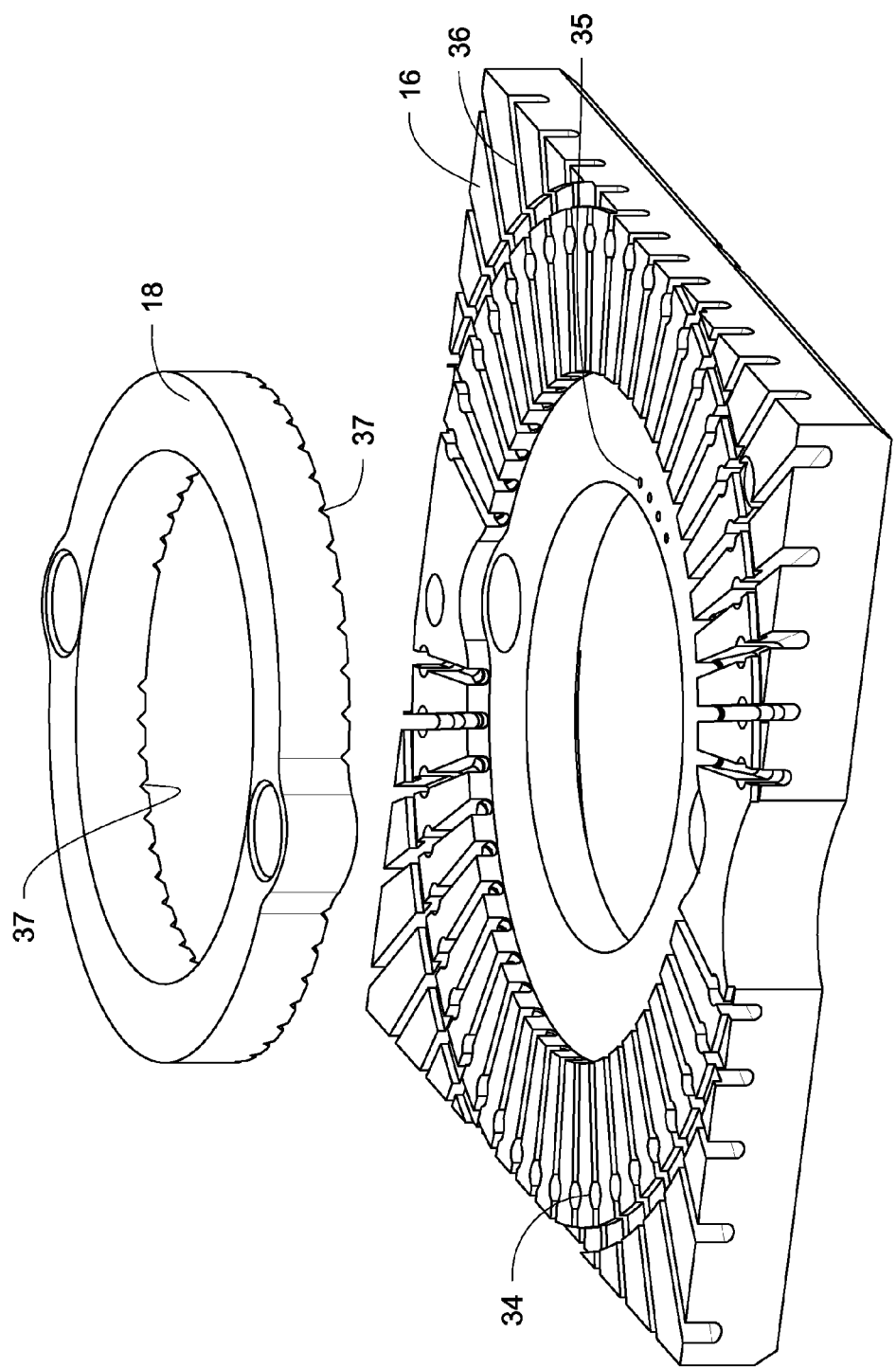
FIG. 5 is a close-up view of the probe apparatus of FIG. 1.

The probe card 10 also includes a connector structure on the other side from where the groove pattern 12 of the wire guide 16 is located, and thus the other side from where the contact pattern of the probe wires 30 is formed. As shown, the connector structure is a retainer member 20. In one embodiment, the retainer member 20 has a view port 26 and a retention slot 28. The view port 26 allows one, such as for example a test operator or assembler, to view the probe wires 30 through the probe card 10. This opening also allows adjusting alignment of the probes. The retention slot 28 allows for an element to be placed within the slot 28 and hold the probe card 10. The retention slot 28 allows the probe card 10 to be part of a test system able to manipulate the position of the probe card 10 and also replace it when needed. As best shown in FIGS. 5 and 6, for example, the retention slot 28 is between two relatively larger portions of the retainer member 20 (see portions above and below the slot 28), such that the retention slot 28 is an indentation relative to the larger portions. In one embodiment, the slot 28 extends around the retainer 20. In some embodiments, an outer portion of the retainer 20 is relatively more oblong than an inner portion next to the wire guide 16 (see e.g. FIG. 5). The difference in shape, for example, can be helpful in interchanging the probe apparatus for another and can also provide a keying feature such that an incorrect probe card without the difference in shape would be prevented from being used as a replacement and/or from being interchanged.

In one embodiment, the probe card 10 has a chassis 24. As shown for example in FIGS. 4-6A, the chassis 24 connects the probe tile 14 to the wire guide 12, clamp 18, and retainer member 20. As shown, the chassis 24 has screw supports extending from the main body, where the screw supports may extend through holes of the clamp 18 and wire guide 16 and toward the retainer member 20. Screws 22 may be inserted into holes of the retainer member 20 and can be fastened to the chassis 24 in the screw supports. It will be appreciated that the chassis, its particular structure, including the screw supports and screws, are merely exemplary as other structures could also be used to assemble and connect the wire guide, clamp, probe tile, and probe wires together.

Referring to the circuit board 40, FIG. 3 shows a top plan view of the circuit board 40 alone. In one embodiment, the circuit board 40 is configured as a plate having a top side, a bottom side (not shown), and an opening 44 through the top and bottom sides. In one embodiment, the circuit board 40 is a motherboard of contacts or traces that helps deliver signals from the probe card 10 to additional test/measurement equipment used, for example in an overall electrical diagnostic system, such as for testing semiconductor devices or other MEMS devices. Such diagnostic and measurement systems are known and can be adapted for use with the probe card and circuit board described herein.

In the example shown, the plate is a circular shape, and the opening 44 is generally through the center of the circular plate. It will be appreciated that other shape configurations may be employed, as well as other placement for the opening. The opening 44 of the circuit board 40 allows for a probe card, e.g. probe card 10, to be placed onto the circuit board 40 and for interchanging probe cards into the opening of the circuit board 40.

FIG. 3 shows a top view of the circuit board 40 alone, but further shows one embodiment of a layout for signal contacts 42 and guard contacts 46. In the example shown, the layout is a pattern of many signal contacts 42 and a pattern of many guard contacts 46 in the form of contact traces on the circuit board 40. As shown in FIG. 3, one embodiment for the configuration of the signal contacts 42 and guard contacts 46 is a spoke-like arrangement and configuration from the center of the plate, for example extending from the opening 44 toward the outer edge of the plate. The inner ends of the signal contacts 42 and guard contacts 46 allow contact with the signal transmitting portion 30a and guard portion 30b respectively of the probe wires 30, so as to allow transmission of signals from the probe card 10 to additional test and measurement equipment. That is, the contact pattern of the probe wires 30 in the probe card 10 match the pattern of signal and guard contacts 42, 46 on the circuit board 40. The structure of the wire guide 16 and clamp 18 help to secure contact and alignment of the probe card 10 with the circuit board 40.

For example, signals transmitted through probe wires 30 of the probe card 10 from testing a semiconductor device, may be transmitted through the pattern of signal contacts 42 as well as the guard contacts 46. For example, a signal through the guard contact can be made to match the voltage of the center conductor (e.g. signal contact) as much as possible to minimize leakage. It is also known to apply the voltage, for example, through a tester which continues to the probe needle, so that the guard signal traverses the interface between the probe card 10 and the circuit board 40. In some embodiments for example, when probe wires are guarded, such as for example covered with a conductive polymer driven guard, such a guarded probe may continue from its contact at the circuit board through the end of the probe needle. It will be appreciated that the signal trace can function without the guard on nonsensitive signals.

FIGS. 3A-3C show additional views of the circuit board 40 of FIG. 3, where in FIG. 3C less detail of the contact pattern is shown. Further description and illustration of circuit boards are also in pending U.S. application Ser. No. 13/010,234, filed Jan. 20, 2011, the entirety of which is incorporated by reference herein.

In operation, each probe wire 30 includes an end configured to probe a device (e.g. the tips 33), such as a semiconductor wafer. With reference to the signal transmitting portion 30a and the guard portion 30b, the signal transmitting portion 30a of each probe wire 30 is configured to contact a respective signal contact 42 in the pattern of signal contacts on the circuit board 40 close to the center of the circuit board 40 and opening 44. Likewise, the guard portion 30b of each wire 30 is configured to contact a respective guard contact 46 in the pattern of guard contacts close to the center of the circuit board 40 and opening 44. See arrows of FIGS. 1 and 2 leading toward the opening 44 of the circuit board 40. As mentioned above, in some embodiment, any one or more of the probe wires 30 may have a conductive polymer on the guard portion 30b. It will be appreciated that the probe wires may be scaled to accommodate additional layers, such as for example, triax and quadrax type connectors.

With further reference to the probing wires 30, characteristics and construction of the probing wires may vary. Previous patents, which discuss probe characteristics and constructions, includes U.S. Pat. Nos. 6,975,128, 6,963,207, 6,992,495, 6,586,954, and 6,201,402, all of which are hereby incorporated by reference in their entirety, wherein one of skill in the art could use the subject matter described in these patents and apply it to probing wires, needles, tips, etc. of any probe test core described herein.

The disclosure herein can provide many structural advantages, among others, such as any one or more as follows.

1. Radiused bottom of probe slots aids in centering probe needles to eliminate mismatch between the replaceable probe core and motherboard.

2. Holes in the frame allow final forming of contact needle as well as inspection of contact position after mating the probe card with the motherboard.

3. The distal end of the probe can be formed into a contact mechanism which eliminates extra parts. For example, where the probe wire 30 contacts the motherboard, there is no need for separate structures to make the contact, such as for example spring pins are not needed to make the contact. Thus, in some configurations for example, the probe wires are constructed to become the contact by special bending. For example, special bending entails forming the probe wire with a geometry, such that contact is made with the motherboard with the proper force and surface area to ensure low contact resistance between the probe wires and motherboard. For example, the contact force may be determined by the unsupported length of the probe wire. For example, the contact surface area may be determined by the radius on the contact. In some instances, it is desired to balance the contact force and contact surface area, so that the contact will not have high resistance, which can preserve the motherboard from wearing out prematurely.

Functionally, the test systems, apparatuses, and equipment herein including for example the probe card and motherboard have observed various one or more of the following benefits, among others, which are outlined below.

1. The probe card is of relatively small size which can save space and costs, while providing ease of manufacture and rebuild.

2. The probe card can provide good contact and crash resistance and durability (e.g. using cantilever design of earlier patents incorporated by reference above).

3. The probes (i.e. probe wires) of the probe card can be constructed and configured so as to provide low noise and low leakage and low capacitance, and also operate within wide temperature ranges. Low leakage performance (e.g. fA/V) has been observed, for example, when 100V is applied to one needle/pin and all other pins are grounded at temperatures of 25° C. and 200° C. Results have shown that low leakage performance of the probes have been obtained, for example, at about 5 fA/V and about 1 fA/V at temperatures of about 25° C., and also at about 0.5 pA/V and about 2 fA/V at temperatures of about 200° C. Differences can depend upon the probe configuration, for example, the structure and configuration of the coating or guard on the probes.

4. The probes of the probe card can allow for high current and voltage testing, while maintaining fault tolerance.

5. The probes can have uniform beam length.

6. The motherboard is configured to perform over a wide range of temperatures, for example, between −65° C. to 220° C.

With further reference to the probe card 10, identification capabilities may be employed to ensure that the proper probe card and circuit board are being applied for testing.

Figure 7:
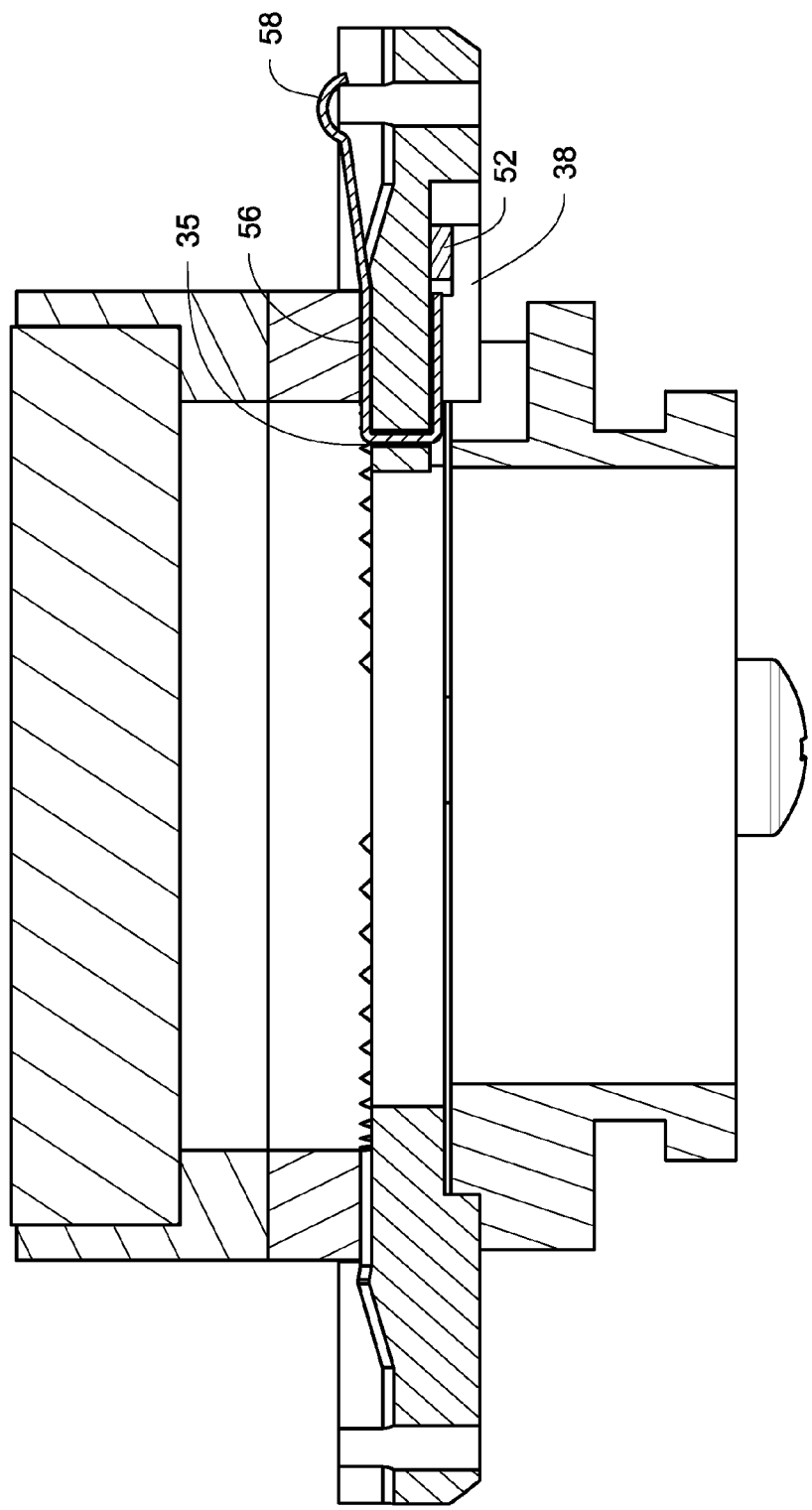
FIG. 7 is another sectional view of the probe apparatus of FIG. 1.
Figure 11:
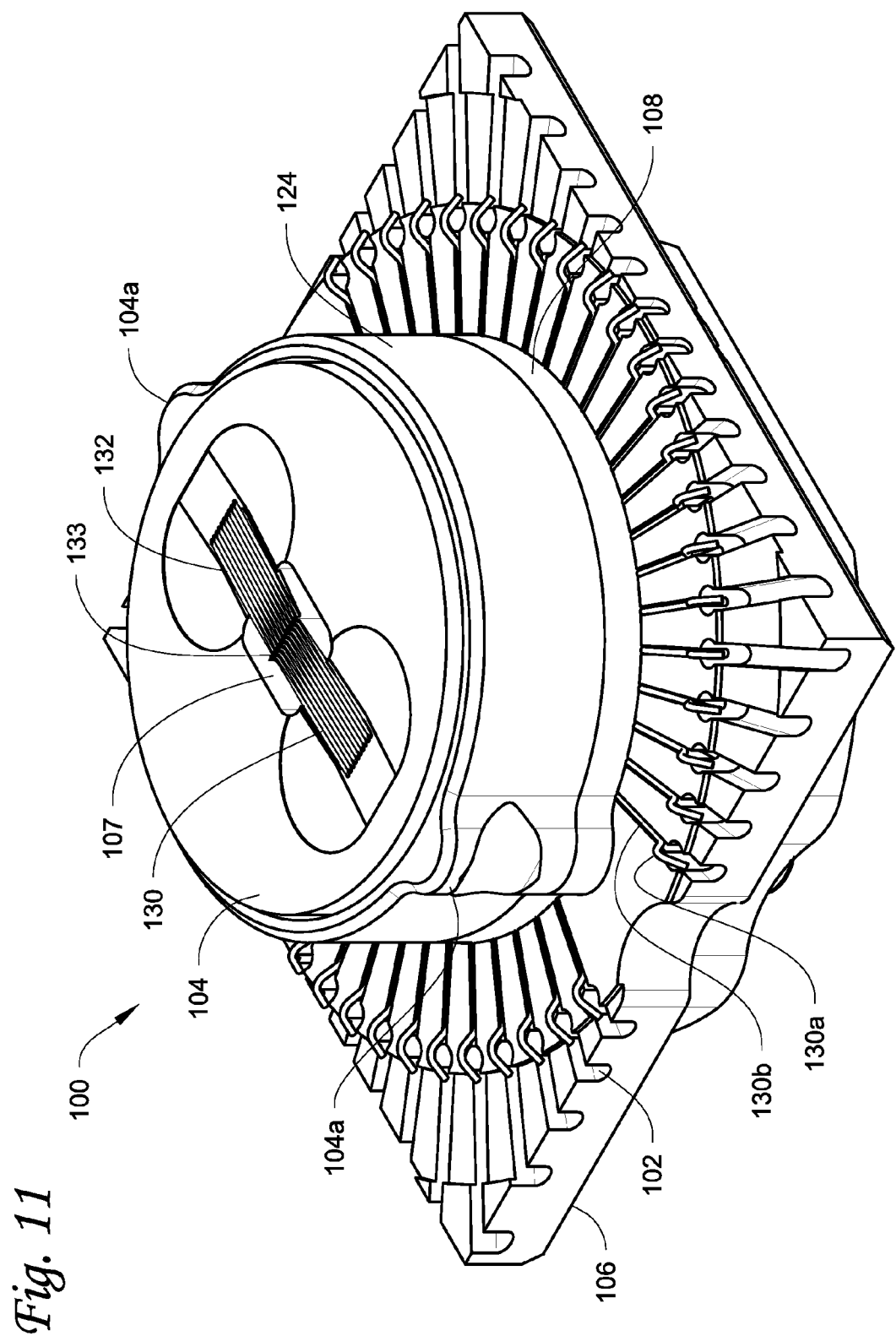
FIG. 11 is a bottom perspective view of another embodiment of a probe apparatus.

One embodiment of this is the use of unique identification resistors attached to the probe card 10. As best shown in FIGS. 5 and 7, resistors 52 are disposed on the wire guide 16. In one embodiment, the wire guide 16 includes a cavity 38, where the resistors 52 are located. Channels 35 allow wires 56 to electrically connect the resistors 52 to the circuit board, e.g. circuit board 40, by way of contact of the wire 56 with the circuit board 40. For example, one wire 56 connected to a resistor 52 is shown extending through a channel 35 and forming a contact 58. The contact 58 makes contact with one of the signal contact traces of the circuit board 40. That is, if identification resistors (e.g. resistors 52) are employed such contacts 58 can otherwise take the place of a probe wire 30 contact and respective probe trace of the circuit board 40 at that particular location of the wire guide 16.

Standard test equipment may be used to read the resistor through the contact 58 of the wire 56 with the circuit board 40.

In other embodiments, the circuit board 40 can include its own identification resistors. As shown in FIG. 3, location 50 indicates where on the board 40 resistors can be placed. In other examples, a resistor pattern R may be at about the 3:00 position in FIG. 3c. Identification resistors on the circuit board 40 can allow for a determination to be made as to whether the correct circuit board is being used. As with the resistors on the probe card, it will be appreciated that standard test equipment may be used to read the resistors on the circuit board 40, such as at location 50. In some embodiments, the circuit board 40 can include traces for temperature feedback. For example, on either side of leader line 44 (e.g. short traces) can be where such traces are located. In other examples, traces T may be at about the 9:00 position in FIG. 3c. Such traces can be used for incorporating a temperature resistor/feedback capability.

As described above, a probe apparatus generally is structured as a probe card that on one side has a contact pattern. The contact pattern is for contacting a respective contact pattern on another test equipment or component, such as a circuit board. The contact pattern of the probe card includes probe wires with tips that probe a device desired for testing.

Signals are transmitted through the probe wires from the probe card, for example, through a circuit board to other diagnostic equipment. The contact of the probe card with the circuit board allows signals to be transferred through the probe wires to the other diagnostic equipment.

On another side of the probe card is a connector structure. The connector structure allows the probe card to be connected or disconnected from a holder.

FIGS. 8-10 show one embodiment of a holder 70. Generally, the holder 70 allows for a probe card (e.g. probe card 10) to be replaced with another probe card. Such other probe card may be for example another probe card with a different contact pattern or another probe card that may be a replacement for a used probe card. In some embodiments, the holder 70 has multiple probe cards connected to it, and is configured to allow for interchanging among the probe cards connected to the holder 70, such as for changing a probe card between testing. In some embodiments, the holder can be part of a system used to test devices, where the holder 70 is able to manipulate and position the probe card as needed.

In the embodiment shown, the holder 70 has a structure that allows for supporting multiple probe cards. The holder 70 allows for interchanging probe cards, such as with respect to a testing need, for example if a device to be tested requires a different probe tip pattern or needle array for testing. It will be appreciated that probe cards may differ in their probe tip pattern, for example to accommodate the device being tested. The holder 70 may also allow for interchanging probes such as for the need to replace an old probe card with a new probe card that is the same as the one already used, but perhaps no longer functioning as required. It will be appreciated that the descriptions with respect to the holder are merely exemplary, as the probe cards may also be replaced with other diagnostic tools. For example, one or more of, or all the probe needle contacts may be shorted together to test contact resistance at the circuit board.

As shown in FIGS. 8-10, the holder 70 includes a main body 72 with several surfaces 74. Each surface 74 represents a location where a probe card, e.g. probe card 10, can be held. In the embodiment shown, the holder 70 has five surfaces 74 and the main body 72 is in the shape of a pentagon wheel. A connector hole or axle hole 78 allows the holder 70 to connect to another equipment that can rotate or revolve the holder 70 about the axis A through the hole 78, so as to switch from one probe card to another. Such other equipment can have a spindle (not shown) that is inserted into the hole 78 and thereby rotate the holder 70. It will be appreciated that switching from one probe to another can be configured as an automated process, where appropriate controlling, processing, and mechanical hardware are employed as necessary to manipulate the holder. It will also be appreciated that pneumatic operation of the holder can be employed so as to eliminate or at least reduce electrical interference with the operation of the probe card.

It will be appreciated that the pentagon wheel structure of the holder is not meant to be limiting, the holder could be constructed as a wheel of other polygonal shapes as appropriate, such as for example a square, triangle, hexagon, or the like. It also will be appreciated that a holder does not have to rotate or revolve to switch from one probe card to another. Other implementations for switching the probe card can be employed. For example, a holder may be configured to translate between probe cards to move the probe cards into/out of probing positions (see e.g. FIG. 15 and described further below).

With reference to the details of the holder 70, an opening 76 is included through each of the surfaces 74. The opening 76 allows for part of the retainer member, e.g. retainer member 20 of probe card 10, to be inserted through the opening 76.

A sliding clip 80 connects the probe card 10 to the holder 70. The sliding clip 80 is slidable along the surface 74 of the holder and can be retained on the main body 72. The sliding clip 80 has a curved edge 82, for example in the shape of a U that engages the slot 28 on the probe card 10. See B in FIG. 9 pointing to the slot of the probe core and the curved edge 82 of the sliding clip 82. In one embodiment, the radius of the curved edge 82 is smaller than the radius and curvature of the opening 76, such that the sliding clip 80 will engage the slot 28 of the probe card 10, but will not allow the probe card 10 to fall out of the opening 76. That is, a portion of the retainer member 20 is able to be inserted into the opening 76, where the sliding clip 80 can be moved to engage the slot 28, but not allow the inserted portion of the retainer member 20 to fall out of the holder 70. Thus, the relative larger portions of the retainer member 20 are on opposite sides of the sliding clip 80, which allows the holder 70 to hold the probe card. FIG. 8 shows a perspective view of the holder with one clip in the non-holding position, with the clip open and ready to receive a probe card, as well as another clip in the holding position. FIG. 9 shows the holder 70 just prior to connection with a probe card. FIG. 10 shows the probe card connected and held by the holder 70. FIG. 10 also shows a plate that can contain the sliding clip 80. For example, the plate can extend from the holder 70 and can be disposed between the probe card 10 and the holder 70. See also the top of the holder 70 in FIG. 9. The plate for example can provide another platform that is on top of the clip 80 before the probe card is placed onto the holder 70.

FIGS. 11-14 show another embodiment of a probe apparatus 100. The probe apparatus 100 is similar to the probe apparatus 10, but has a connector structure that is different from the retaining member and slot configuration of the probe apparatus 10, among other differences. Similar to probe apparatus 10, the probe apparatus 100 includes a wire guide 106 with a groove pattern 102, a clamp 108, and a probe tile 104. The probe tile 104 can have a tab and notch structure 104a for example for mating with a circuit board, e.g. 40. The probe tile 104 can be assembled with the wire guide 106 and clamp 108 for example through a chassis 124. As with probe apparatus 10, the probe apparatus 100 also includes probe wires 130 with probe needles 132 and probe tips 133 for contacting the semiconductor device, such as for example a semiconductor wafer or MEMS device. The probe tile 104 can also include one or more channels (not shown), but e.g. such as channels 15 of apparatus 10. An opening 107 in the probe tile 104 allows the probe tips 133 to extend out of and be exposed from the probe tile 104. Each of the probe wires 130 include a signal transmitting portion 130a and a guard portion 130b. Other structures, configurations, and materials similar to probe apparatus 10 are not further described. It will be appreciated that the probe apparatus 100 can also incorporate the identification capability, e.g. use identification resistors, in the same or similar manner as described above with respect to probe apparatus 10.

Figure 12:
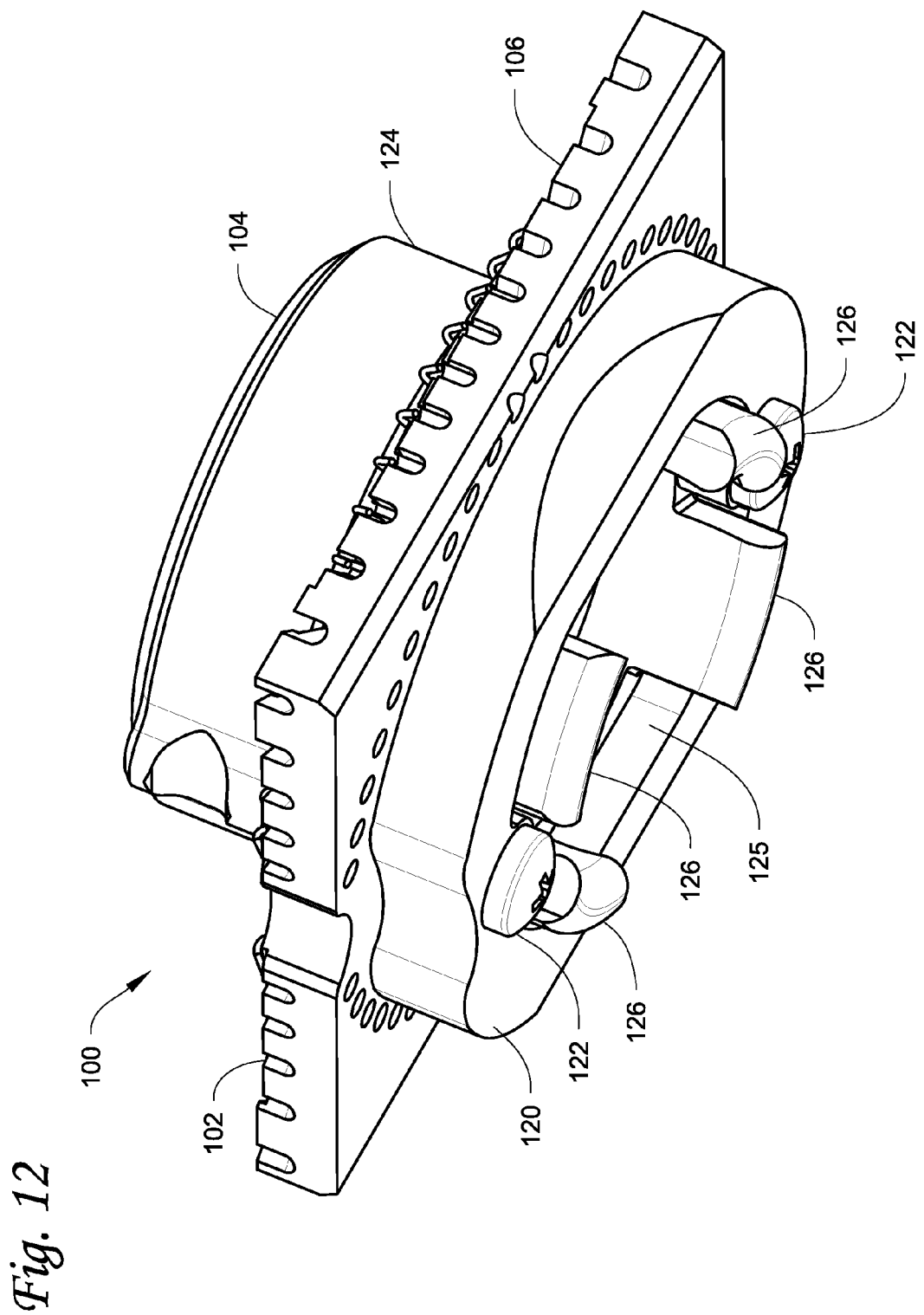
FIG. 12 is another perspective view of the probe apparatus of FIG. 11.
Figure 13:
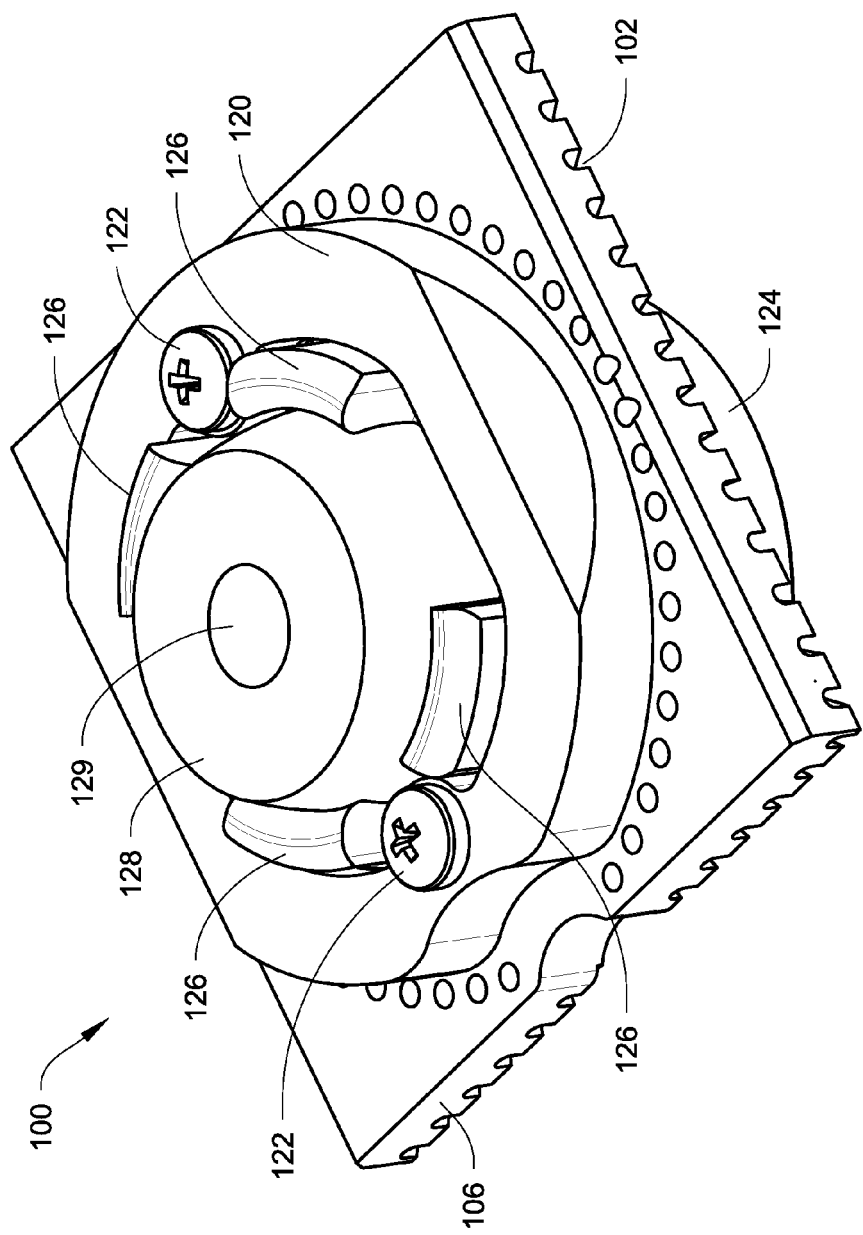
FIG. 13 is another perspective view of the probe apparatus of FIG. 11.
Figure 14:
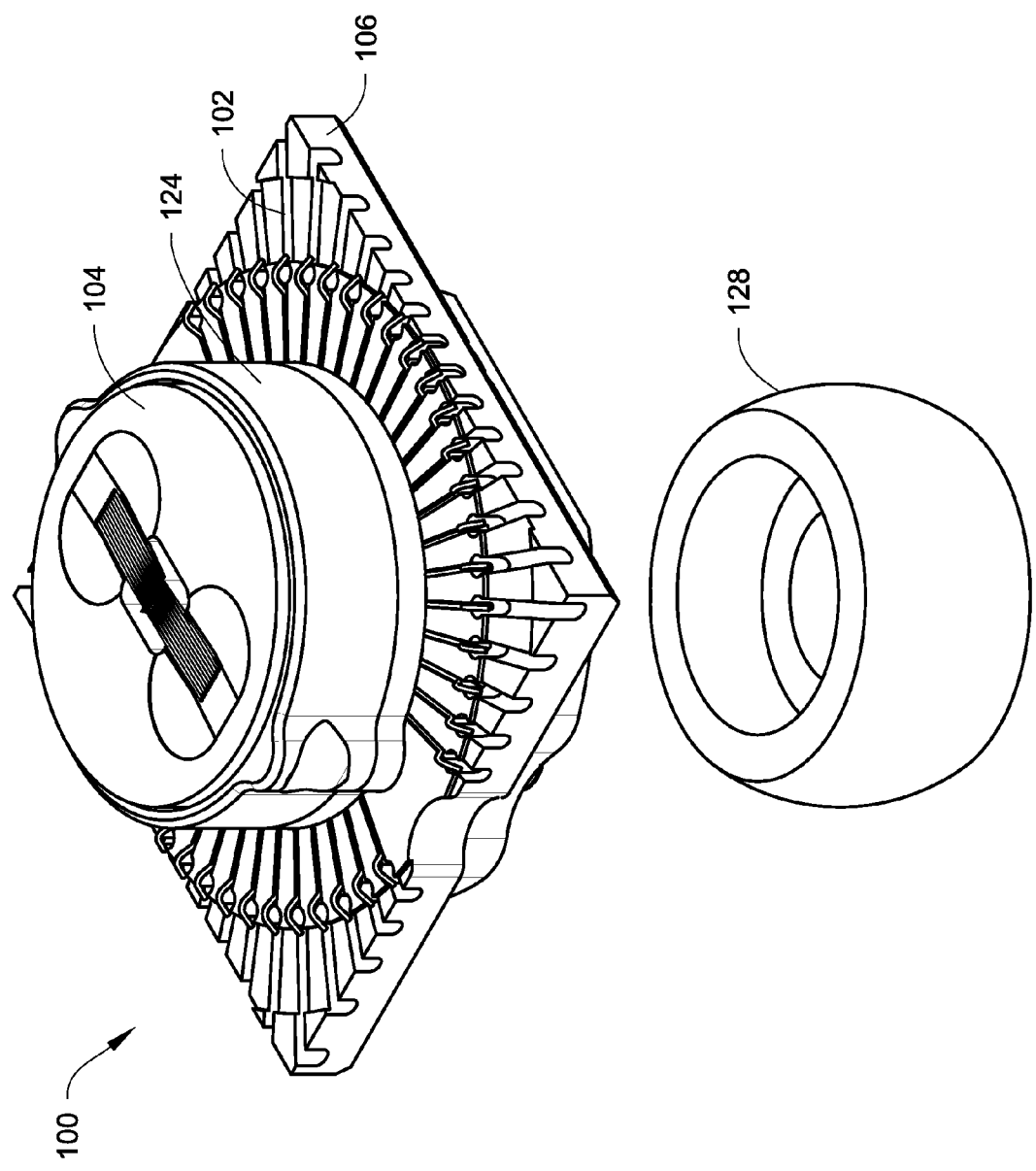
FIG. 14 is a partially exploded view of the probe apparatus of FIG. 11.

With particular reference to FIGS. 12-14, the probe apparatus 100 shows a different connector structure than for example the probe apparatus 10. The connector structure of probe apparatus 100 is configured as a ball and socket type mount, where a retainer member 120 includes a socket area 125. In one embodiment, the retainer member 120 for example is constructed of a main body that can be connected for example to the wire guide 106 by screws 122. In one embodiment, the socket 125 is configured to receive a ball mount member 128.

In one embodiment, the ball and socket mount can allow slight movement, such as tilting movements, of the probe card which can facilitate good mating, for example to a circuit board. As shown, the retainer member 120 is configured to include the socket 125 or opening on one side of the probe apparatus 100. One or more supports 126 can be positioned toward the outer portion of the socket 125. The socket 125 is configured to receive the ball mount member 128, while the supports 126 allow for the ball mount member 128 to be fitted within the socket 125. The ball mount member 128 and socket 120 thus can provide another mount configuration. In the example shown, four supports 126 are shown, but it will be appreciated that more or less supports may be employed as appropriate and/or necessary. It will be appreciated that each support 126 may have some area of clearance on the other side from which it engages the ball mount member 128, which can allow for some movement of the supports to allow for the ball mount member 128 to be fitted in the socket 125.

With reference to the ball mount member 128, it will be appreciated that the ball mount member 128 may be part of and/or be removably connected with another holder equipment. For example, a hole 129 may allow the ball mount member 128 to be connected to a holder equipment that is configured to allow interchanging and/or replacement of a probe apparatus, e.g. probe apparatus 100. For example, the holder as described above may be modified to connect to the ball mount member 128 rather than using the retainer slot and clip configuration. For example, a member on a holder may be inserted into the opening 129 of the ball mount member 128 to retain the ball mount member 128, thus retaining the probe apparatus 100 when the ball mount member 128 is connected to the supports 126 of the socket 125. It will be appreciated that depending on the holder employed, the probe apparatus 100 may be replaced with the ball mount member 128 or be replaced from the ball mount member 128, e.g. disconnecting the ball and socket engagement. It will be appreciated that in some embodiments, the ball and socket can be interchanged, for example, the ball mount member can be on the probe card and the socket on a holder to which the probe card may be connected.

FIGS. 17-20 show another embodiment of a probe apparatus 300 or probe card. The probe apparatus 300 is similar to the probe apparatus 100, and is similar to probe apparatus 10, but has a connector structure that is different from the retaining member and slot configuration. Similar to probe apparatus 100, the probe apparatus 300 includes a wire guide 306 with a groove pattern 302, a clamp 308, and a probe tile 304. The probe tile 304 can have a tab and notch structure 304a, 304b for example for mating with a circuit board, e.g. 40, and for connection/disconnection of the probe card. The probe tile 304 can be assembled with the wire guide 306 and clamp 308 for example through a chassis 324. As with probe apparatus 100, the probe apparatus 300 also includes probe wires (e.g. probe wires 130 from probe card 100) with probe needles (e.g. probe needles 132 from probe card 100) and probe tips (e.g. probe tips 133 from probe card 100) for contacting the semiconductor device, such as for example a semiconductor wafer or MEMS device. The probe tile 304 can also include one or more channels (not shown), but e.g. such as channels 15 of apparatus 10. Probe card 300 can also have an opening (e.g. opening 107 from probe card 100) in the probe tile 304 to allow the probe tips (e.g. 133) to extend out of and be exposed from the probe tile 304. Each of the probe wires (e.g. 130) can include a signal transmitting portion and a guard portion (e.g. signal transmitting portion 130a and guard portion 130b from probe card 100). Other structures, configurations, and materials similar to probe apparatus 100 and 10 are not further described. It will be appreciated that the probe apparatus 300 can also incorporate the identification capability, e.g. use identification resistors, in the same or similar manner as described above with respect to probe apparatuses 100 and 10. In one embodiment, resistor 350 may be used, which is similar to 52 of probe apparatus 10, and can also be employed to monitor the function of the probe card, e.g. operating temperature. It will be appreciated that a diode may also be employed.

With further reference to wire guide 306, in some embodiments, the wire guide 306 may employ a beveled edge 310 at portions of the perimeter of the wire guide 306. The beveled edge 310 can allow for ease of placement and mounting of the probe card 300 when it is to be used and contacted for example to a circuit board (e.g. 40) and device under test such as a semiconductor device. In some embodiments, as also shown in probe card 100, the wire guide 306 may also have a notch structure 312 which can further help with alignment and placement of probe card 300 when it is to be in use.

As with probe card 100, the probe apparatus 300 shows a different connector structure than for example the probe apparatus 10. The connector structure of probe apparatus 300 is configured as a socket type mount, for ball and socket type connection, where a retainer member 320 includes a socket 325. In one embodiment, the retainer member 320 for example is constructed of a main body that can be connected for example to the wire guide 306 by screws 322. In one embodiment, the socket 325 is configured to receive a ball mount member 328, which can be part of an indexing mechanism that is further described below.

In one embodiment, the socket mount can allow slight movement, such as tilting movements, of the probe card which can facilitate good mating, for example to a circuit board. As shown, the retainer member 320 is configured to include the socket 325 or opening on one side of the probe apparatus 300. One or more supports 326 can be positioned toward the outer portion of the socket 325. The socket 325 is configured to receive a ball mount member 328, while the supports 326 allow for the ball mount member 328 to be fitted within the socket 325, such as by a press fit or interference fit. The ball mount member 328 and socket 325 thus can provide another mount configuration. In the example shown, four supports 326 are shown, but it will be appreciated that more or less supports may be employed as appropriate and/or necessary. It will be appreciated that each support 326 may have some area of clearance on the other side from which it engages the ball mount member 328, which can allow for some movement of the supports to allow for the ball mount member 328 to be fitted in the socket 325.

With reference to the ball mount member 328, it will be appreciated that the ball mount member 328 may be part of and/or be removably connected with another holder equipment. For example, a hole 329 may allow the ball mount member 328 to be connected to a holder equipment that is configured to allow interchanging and/or replacement of a probe apparatus, e.g. probe apparatus 300. For example, the holder as described above may be modified to connect to the ball mount member 328 rather than using the retainer slot and clip configuration. For example, a member on a holder may be inserted into the opening 329 of the ball mount member 328 to retain the ball mount member 328, thus retaining the probe apparatus 300 when the ball mount member 328 is connected and fitted to the socket 325. It will be appreciated that, depending on the holder employed, the probe apparatus 300 may be replaced together with the ball mount member 328 or it may be replaced from the ball mount member 328, e.g. disconnecting the ball and socket engagement.

Figure 15:
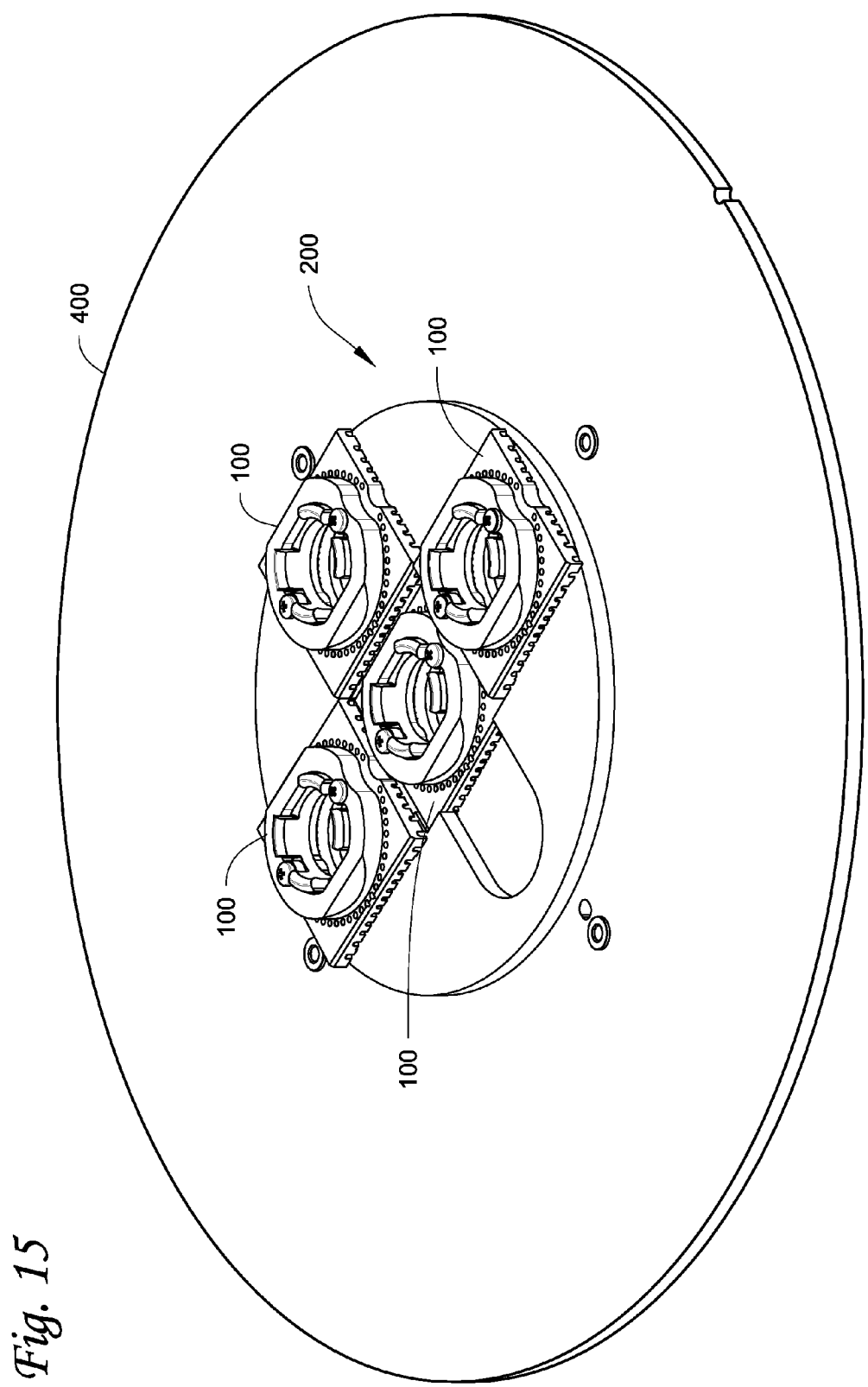
FIG. 15 is a perspective view of one embodiment of translational indexing of multiple probe apparatuses.
Figure 16:
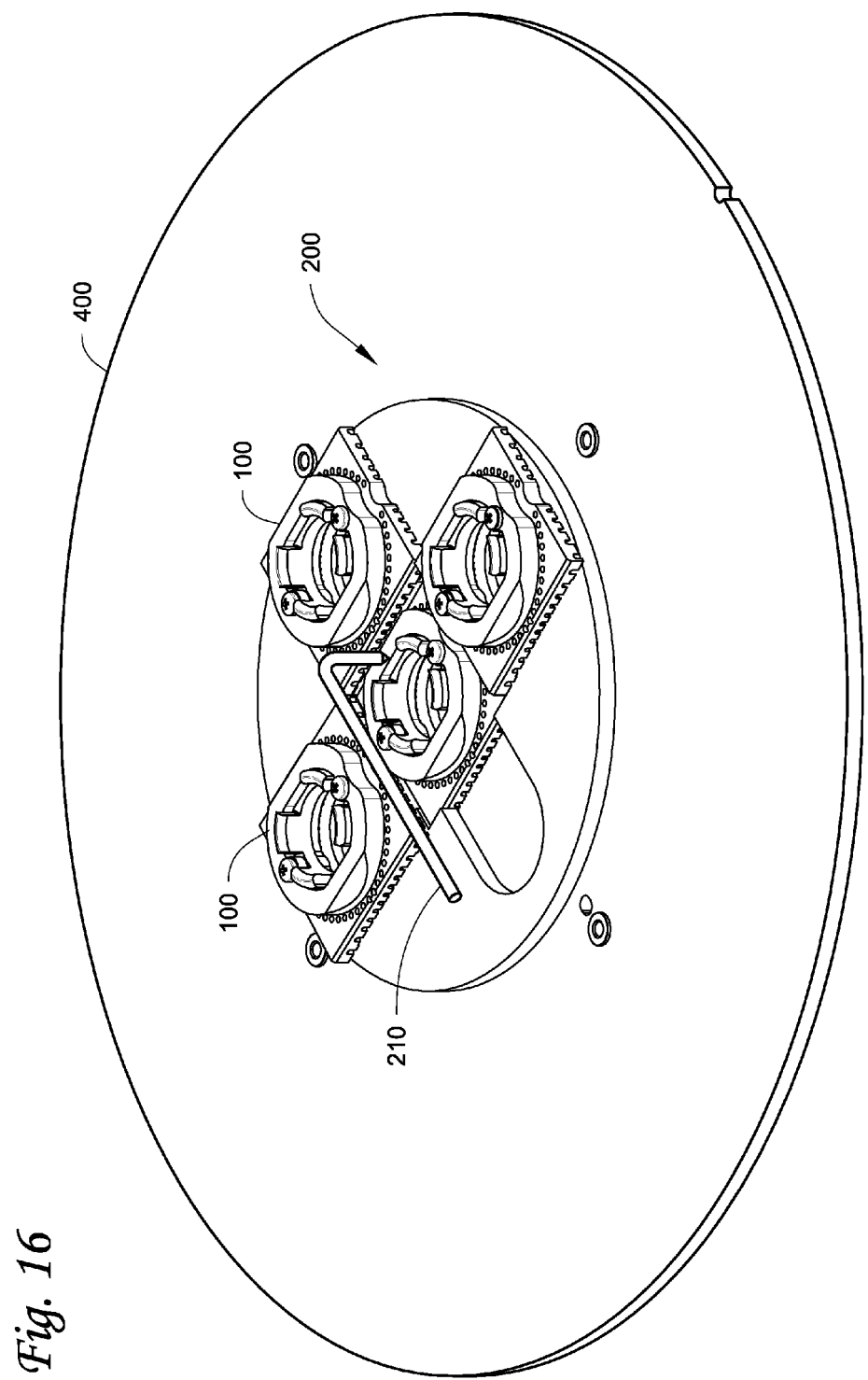
FIG. 16 shows another perspective view of the translational indexing shown in FIG. 15.
Figure 17:
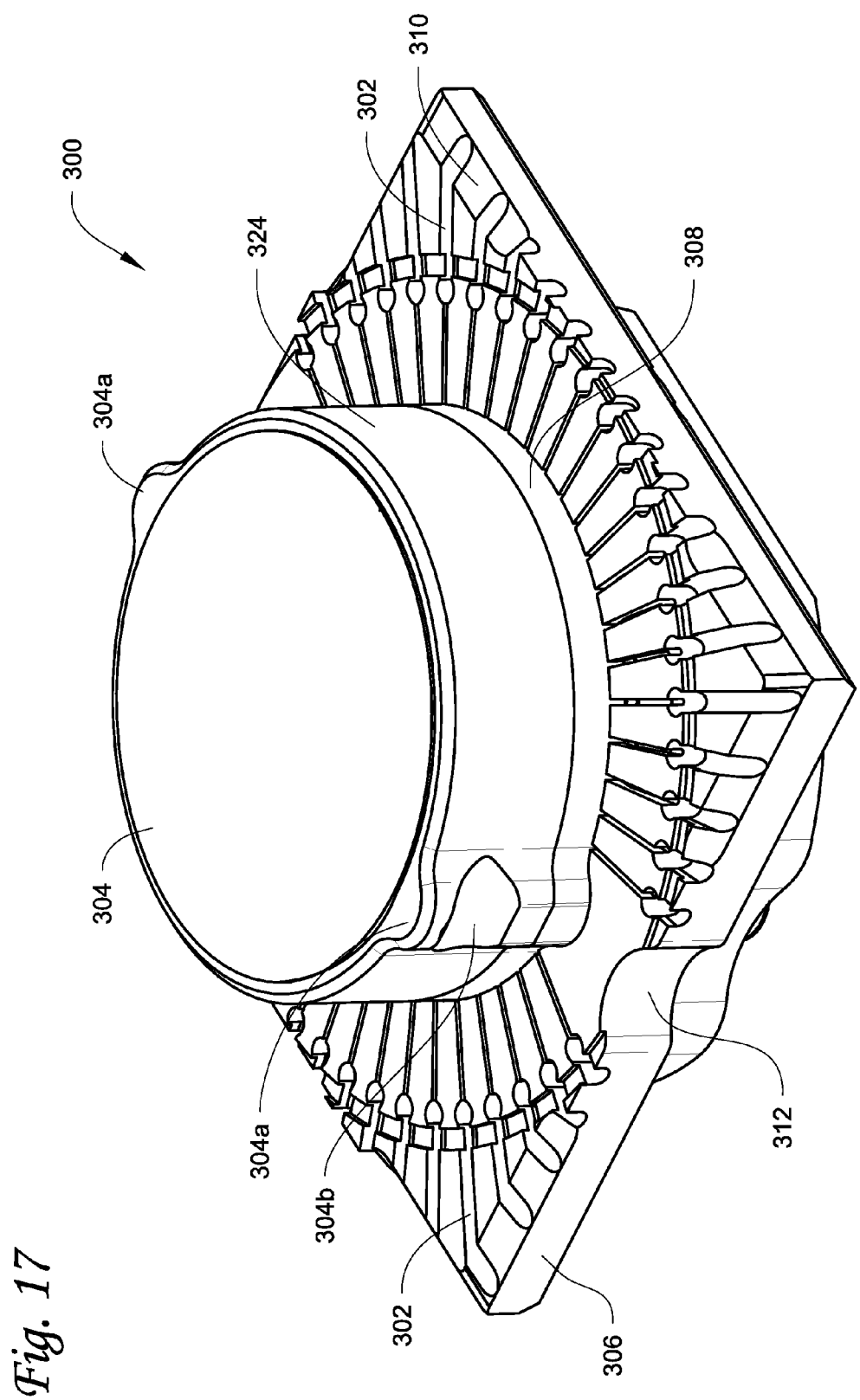
FIG. 17 is a top perspective view of another embodiment of a probe apparatus.
Figure 18:
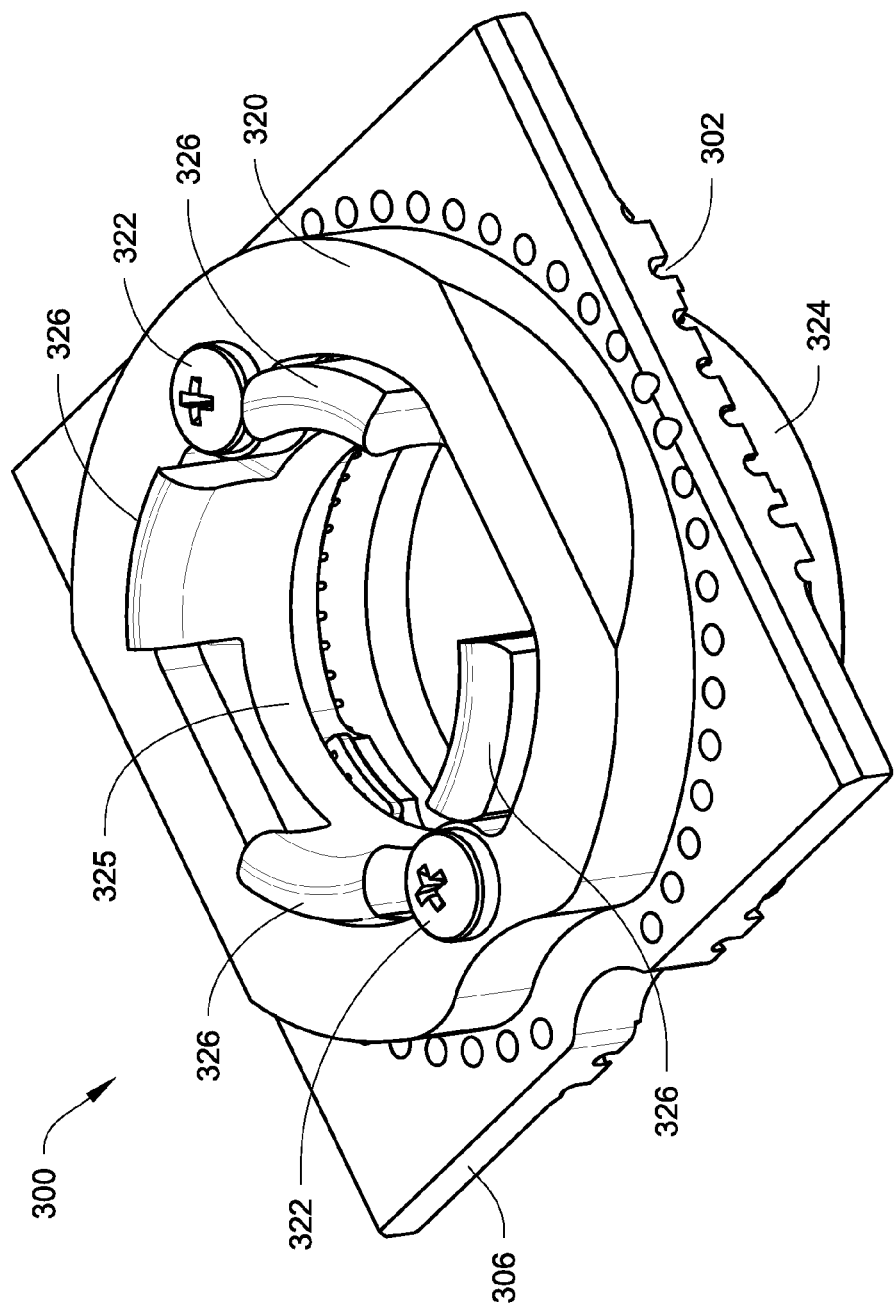
FIG. 18 is a bottom perspective view of the probe apparatus of FIG. 17.
Figure 19:
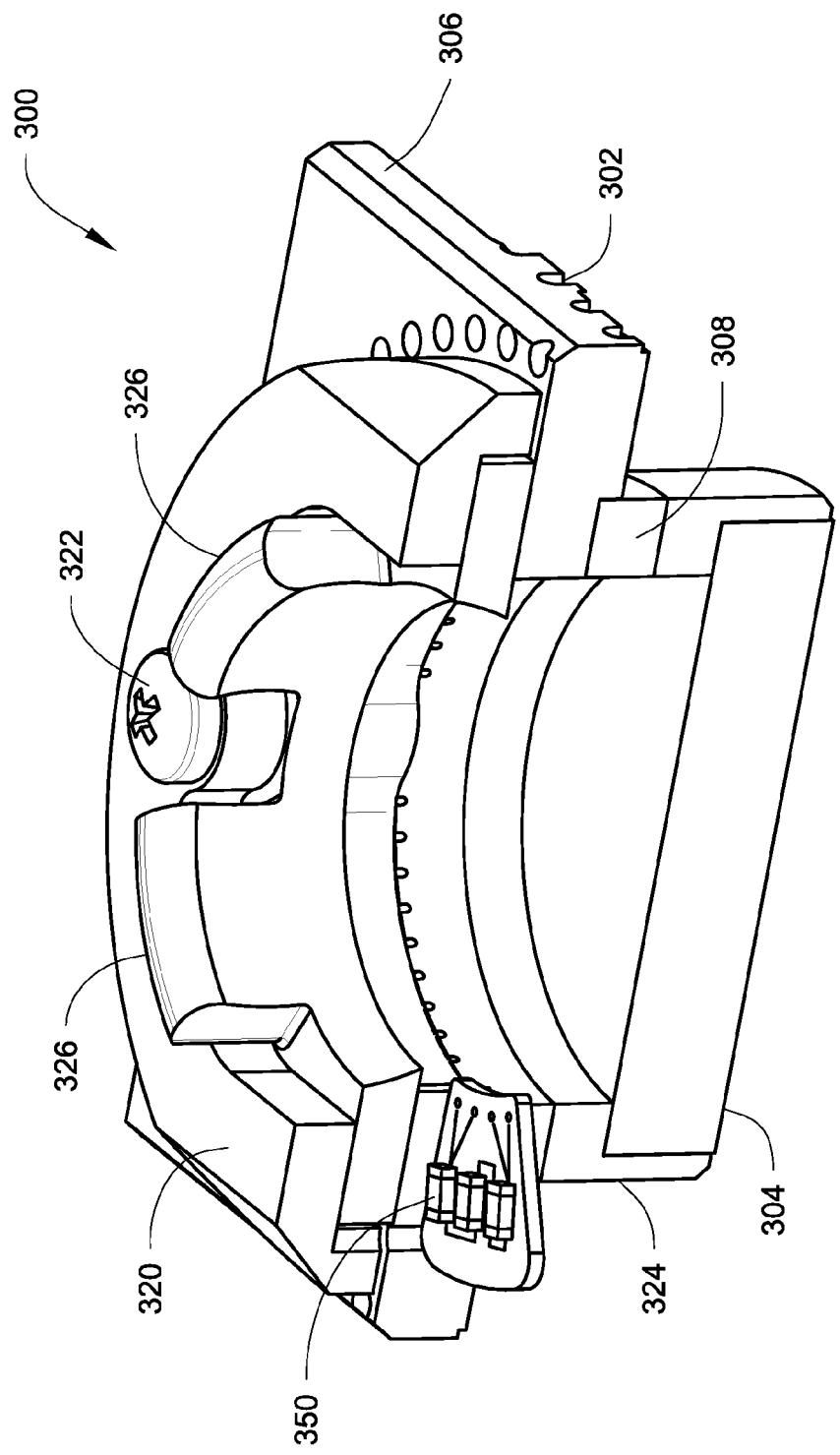
FIG. 19 is a sectional view of the probe apparatus of FIG. 17.
Figure 20:
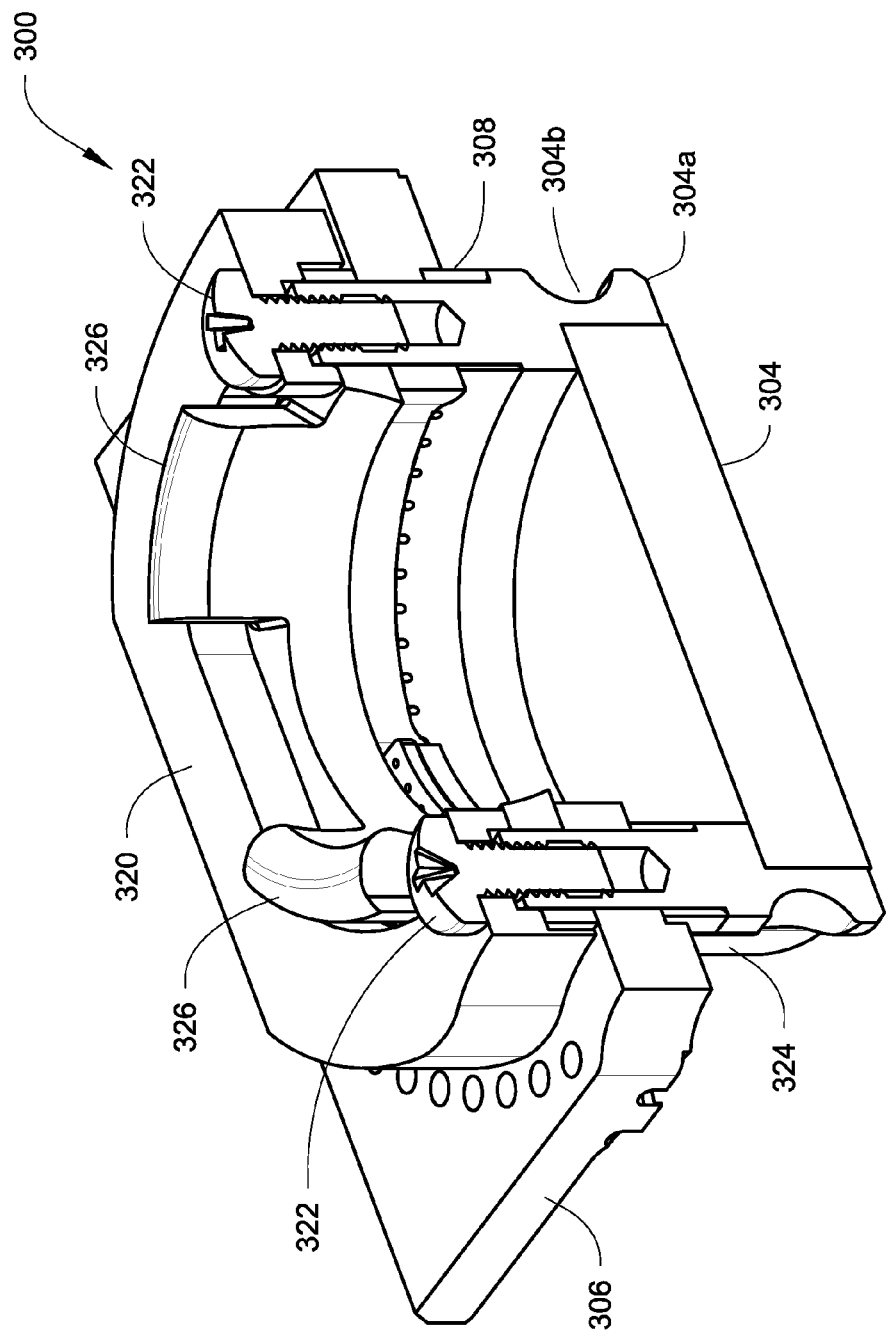
FIG. 20 is another sectional view of the probe apparatus of FIG. 17.
Figure 21:
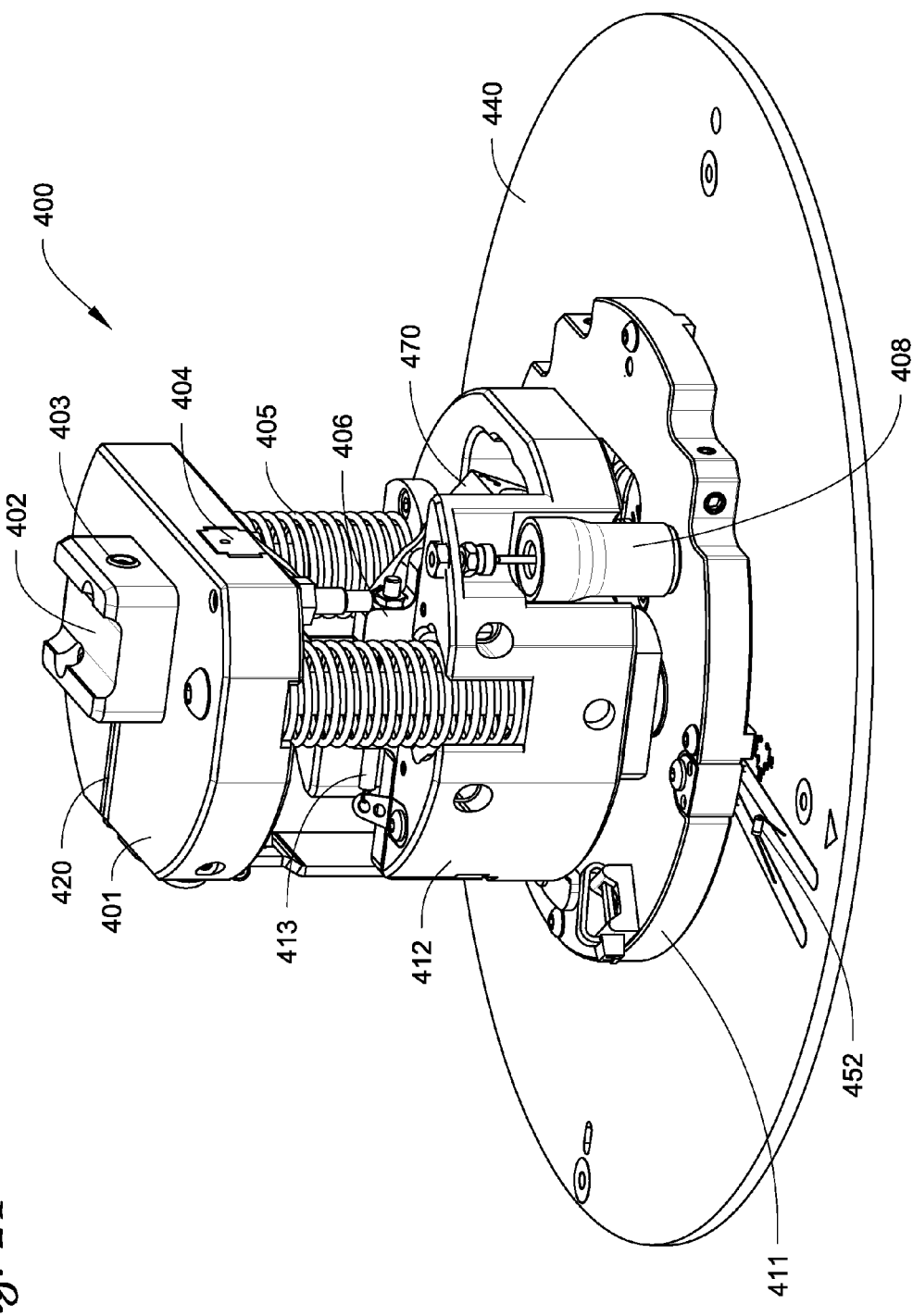
FIG. 21 is a perspective view of one embodiment of a testing system.

FIGS. 15 and 16 are perspective views of one embodiment of translational indexing 200 of multiple probe apparatuses. As noted above, a holder may be configured to translate between probe cards. FIG. 15 shows one embodiment of such translational indexing. Different from a rotational indexer, such as holder 70, FIG. 15 shows a circuit board 400 for interchanging probe cards. For example, probe apparatus 100 may be employed as the probe cards in such a translational indexing implementation. Four interchangeable probe cards 100 are shown, but it will be appreciated that more or less than four probe cards may be employed.

In one embodiment, probe card 100 in the center of the circuit board 400, may be selected, moved and then dropped into the probing position. In one embodiment, an actuator or other movable component, can select a probe card 100, and then move and drop it into the probing position. Likewise, a probe card 100 in the probing position can be lifted and moved out of the probing position and, for example, replaced with a different probe card. FIG. 16 shows an example of a canter or actuator structure for moving the probe cards 100. In one embodiment, such a structure may be configured for example as an arm 210 that can select and move a probe card 100 as needed into and out of the probing position, and to replace a probe card 100.

It will be appreciated that switching from one probe to another can be configured as an automated process, where appropriate controlling, processing, and mechanical hardware are employed as necessary to manipulate the holder. It will also be appreciated that pneumatic operation of the holder can be employed so as to eliminate or at least reduce electrical interference with the operation of the probe card.

FIGS. 21-27 show one embodiment of a testing system 400, including multiple sectional views of the system 400. Generally, a holder structure 470 is shown with a carriage and indexing components. In the embodiment shown, the holder 470 has a structure that allows for supporting multiple probe cards, for example the holder 470 can be constructed as a pentagon wheel where, on each side 476 of the pentagon, a probe card (e.g. probe cards 100, 300) may be mounted. The carriage is an assembly on a frame that moves the holder so as to put a probe card mounted thereon into contact with both a device under test (e.g. semiconductor wafers) and a circuit board 440 (or e.g. 40). The carriage for example moves the holder 470 up and down to contact a probe card with the circuit board 440. The carriage also can rotate the holder 470 so as to move from one side of the holder 470 (e.g. pentagon as shown) to another side of the holder 470, which allows for a different probe card on the holder 470 to be used, for another probe card to be mounded, and/or for a probe card on any side of the holder to be replaced/removed.

The system 400 can include the circuit board 440, the holder 470, and the carriage assembly which includes a frame structure and indexing components, the details of which are further described below.

In one embodiment, the frame includes a top plate 401 connected to a lower plate 411, such as by a wire channel 419 that may be used a wire guide for wires extending along wire groove 420. A carriage mid-frame 412 is between the top plate 401 and lower plate 411 and is connected to the holder 470 using a shaft 480 extending through an opening 478 of the holder 470, which also allows for rotation of the holder on the carriage (see e.g. FIG. 23). The carriage mid-frame 412 is connected with the top plate 401 and is allowed to move up and down relative to the top plate 401 by use of pneumatic control. With specific reference to FIG. 24 for example, an air lift cylinder 408 is shown connected to the carriage mid-frame 412 and is used to move the frame 412 up and down relative to a device under test and the circuit board 440. The air lift cylinder 408 can be connected to an air source. The carriage can be spring loaded and can include for example a hold down spring 405 around a lift guide bushing 414 and a lift guide shaft 416 to guide the frame 412. The hold down spring 405 can provide a downward force on the probe card, while the air cylinder 408 can help fix the carriage in place. The pneumatic lift can eliminate or at least avoid electrical noise near where measurements are taken. In some embodiments, a lift stop 415 may be employed to limit movement of the frame 412 in the up and down directions.

Figure 22:
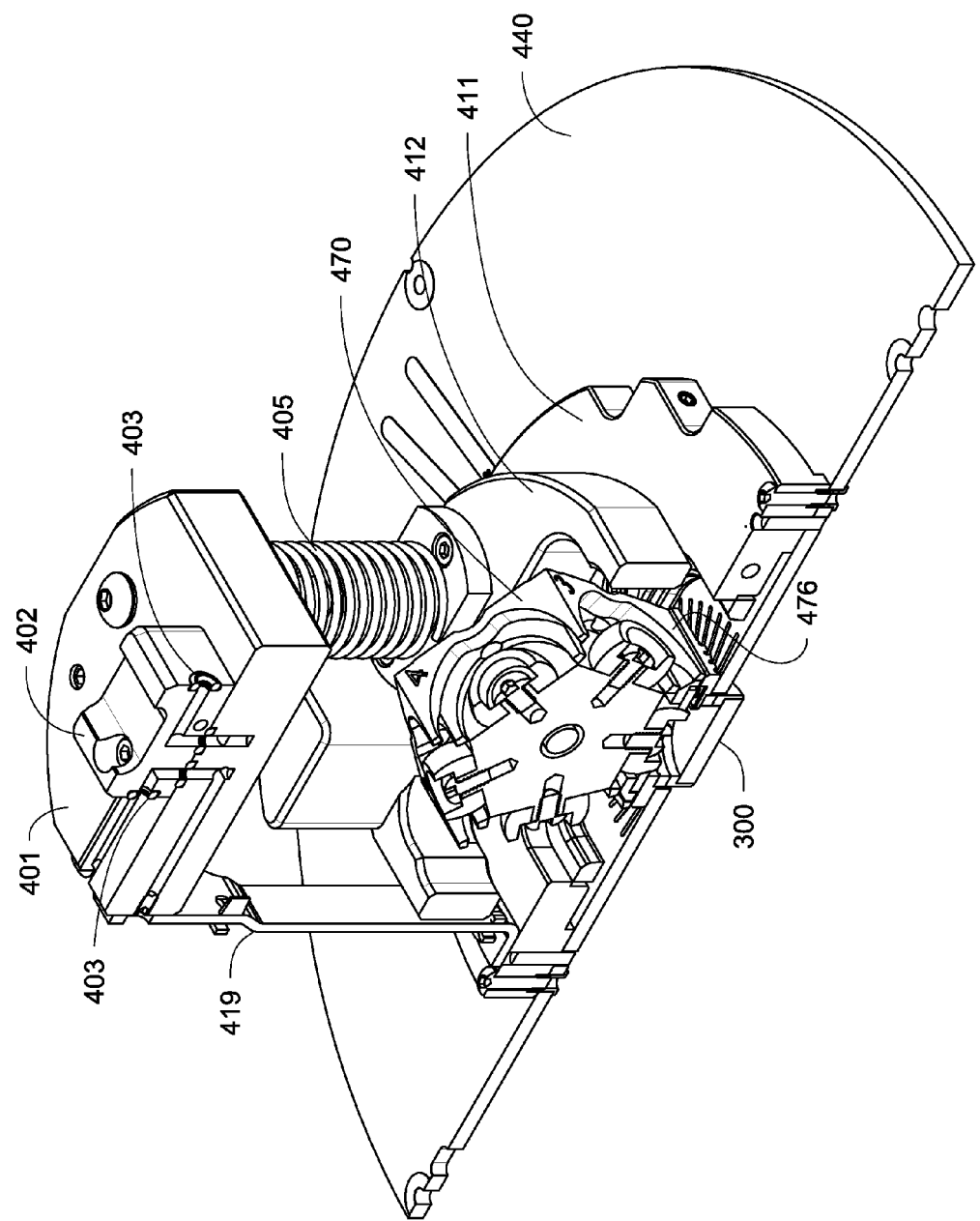
FIG. 22 is sectional view of the testing system of FIG. 21.
Figure 23:
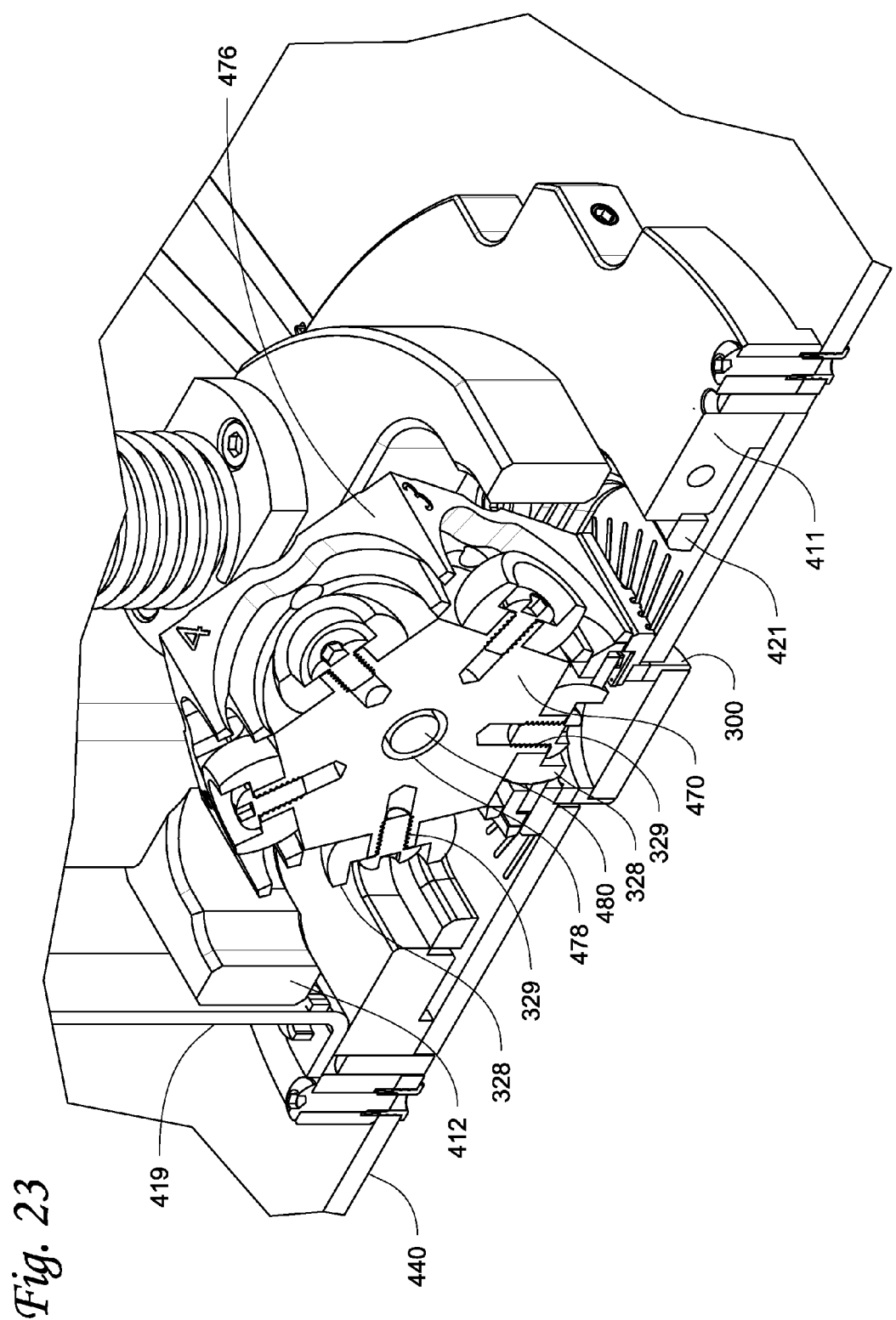
FIG. 23 is a partial sectional view of the testing system of FIG. 21.
Figure 24:
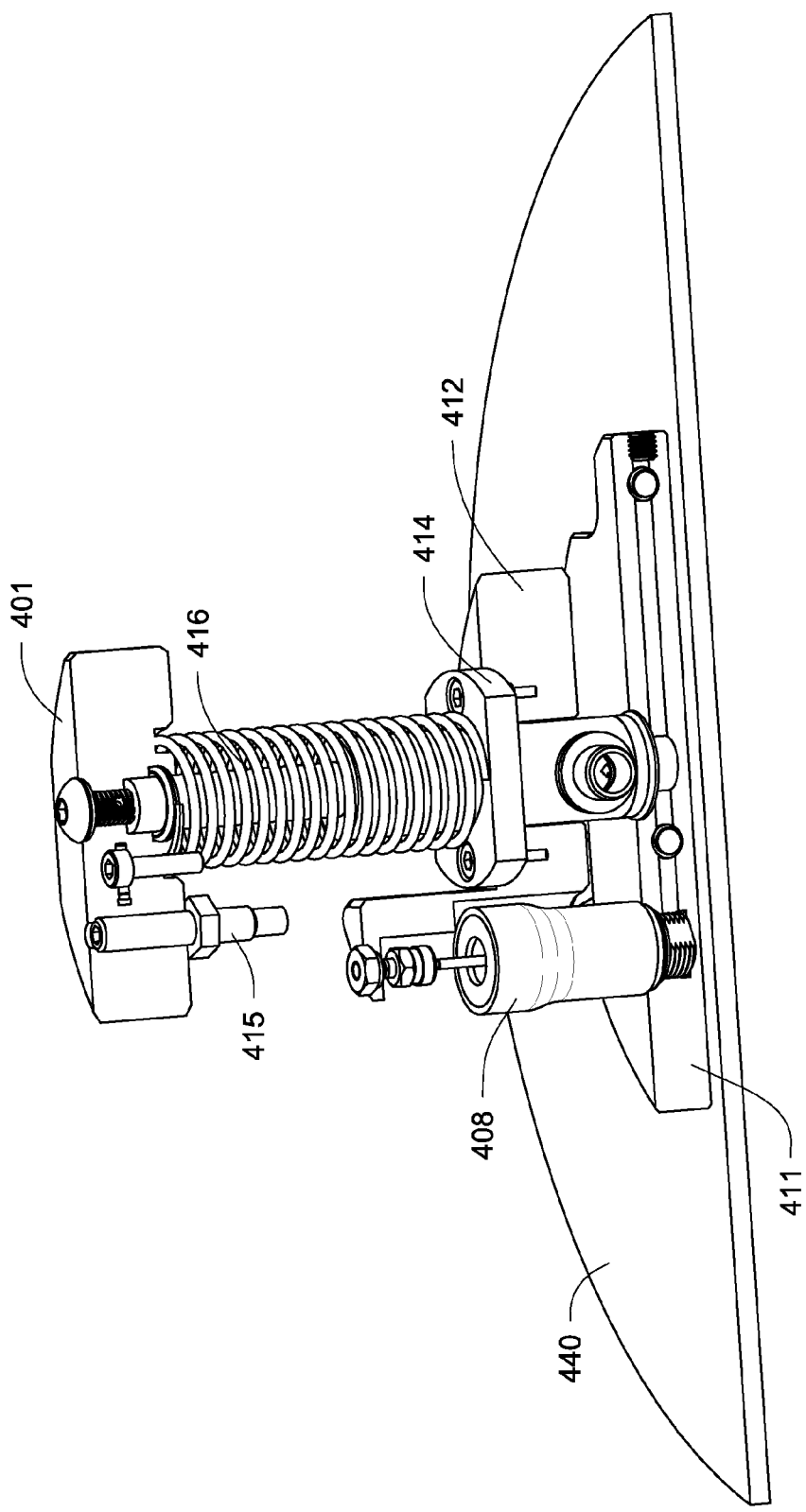
FIG. 24 is another sectional view of the testing system of FIG. 21.
Figure 25:
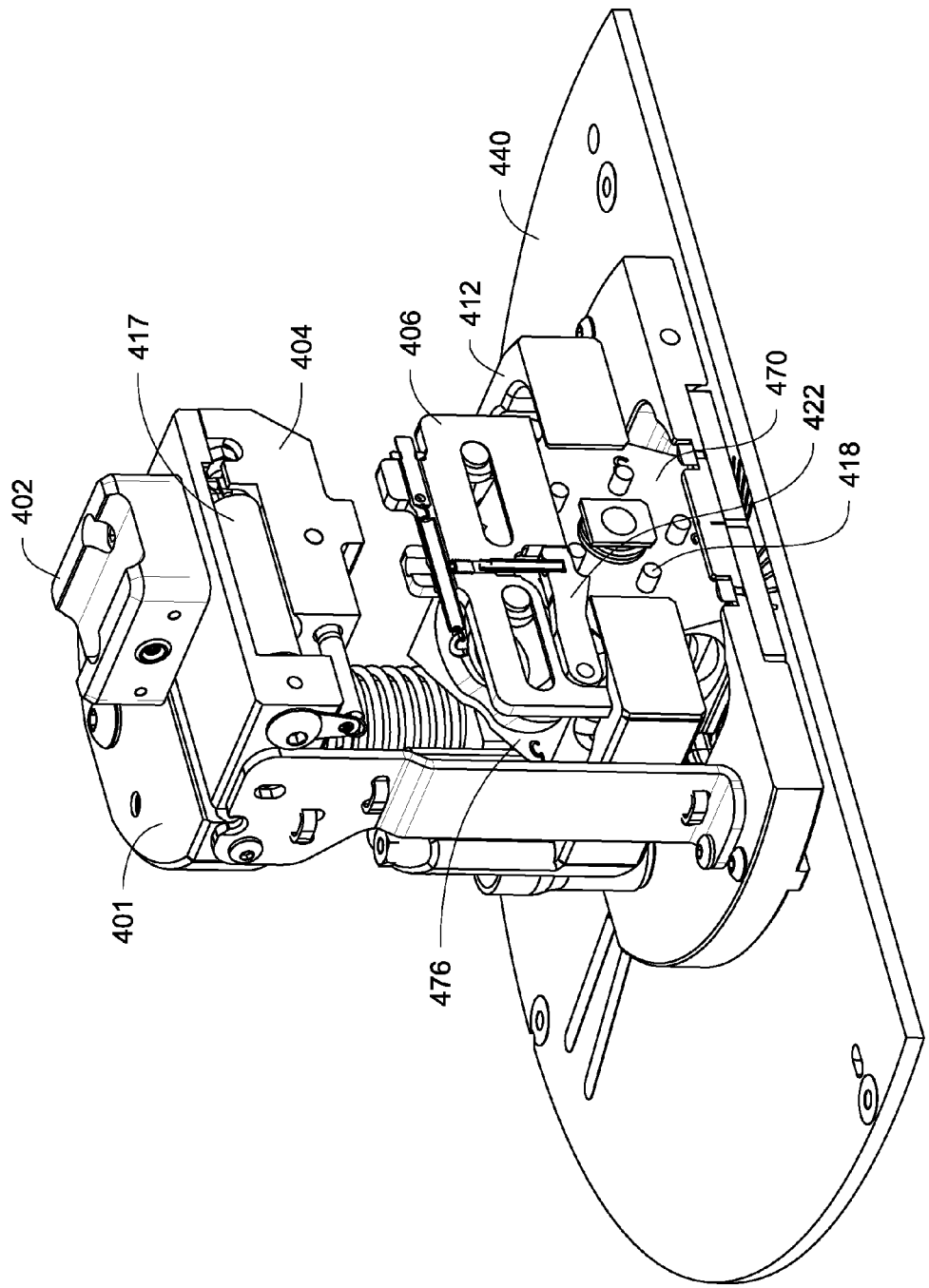
FIG. 25 is another sectional view of the testing system of FIG. 21.

With further reference to the holder 470, each side 476 of the holder 470 can include the ball mount 328 described above, such that a socket on a probe card (e.g. probe cards 100, 300) can be mounted onto the holder 470. As shown in FIGS. 22 and 23, for example, one probe card 300 is mounted and in probing position. As one example, the ball mount 329 can be connected to the holder 470 by a screw and the socket (e.g. 325) of the robe cards can be snap fitted with the ball mount 328.

Figure 26:
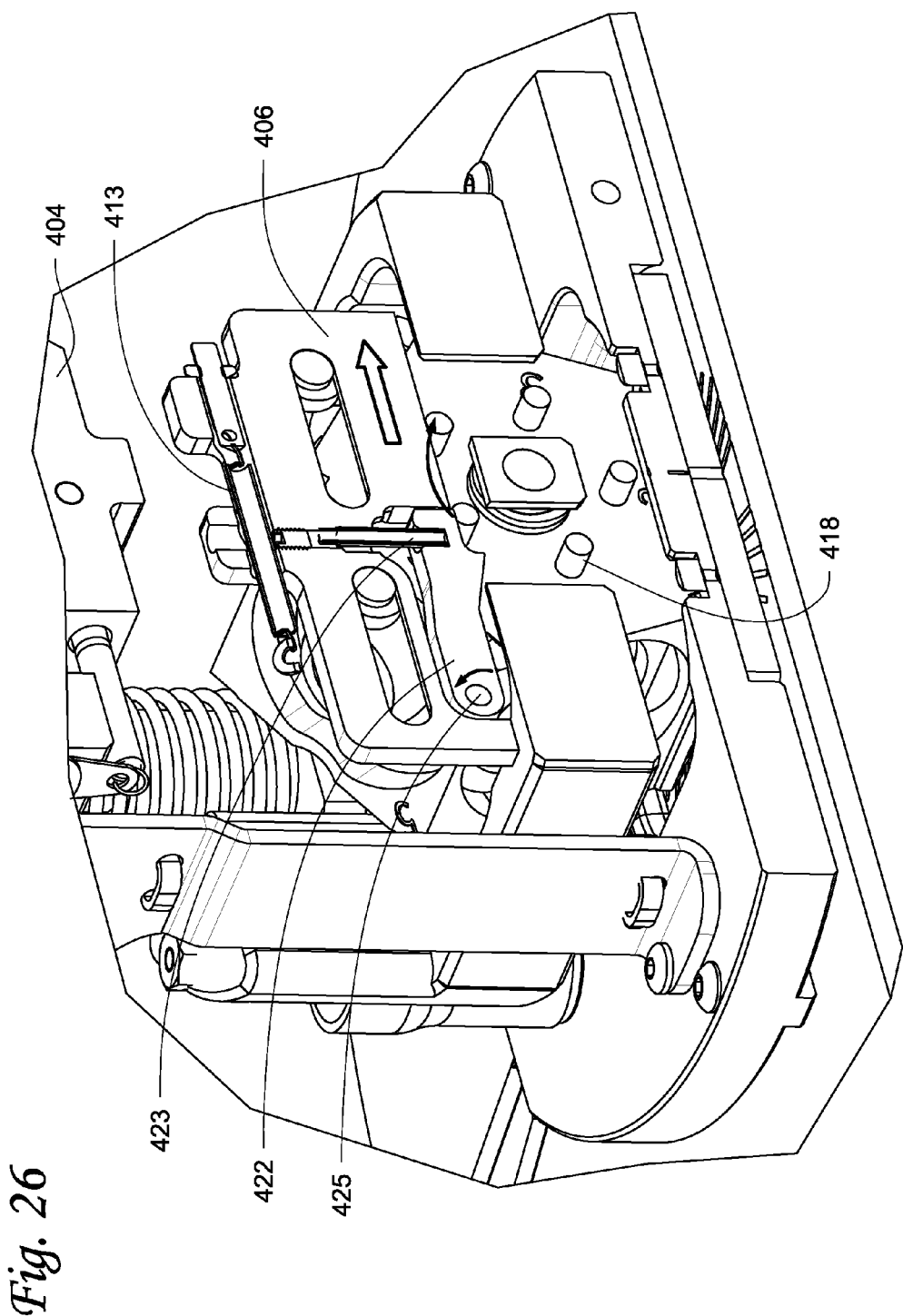
FIG. 26 is another partial sectional view of the testing system of FIG. 21.

With reference to the indexing components, the system 400 may employ for example an index slide and index drive construction to move the holder 470, where index slide 406 moves from one position to another position to engage the holder 470 and rotate it around the shaft 480. See e.g. FIGS. 25 and 26. The index slide 406 can be driven by index driver 404, which can be pneumatically activated such as by an index air cylinder 417 and connected to an air source. In one embodiment, the holder 470 has index drive pins 418 thereon that can be engaged by a hook or pawl 422 connected to the index slide 406. For example, the holder 470 can be rotated to switch out a probe card (e.g. probe card 300) from the probing position and also to allow replacement/removal of probe card from any of the sides of the holder 470. The carriage moves the holder 470 upward to allow the index driver 404 to engage the index slide 406, such as by a protrusion and recess engagement of the index driver 404 and the index slide 406. The index driver 404 can then be moved to impart movement on the index slide. For example, as shown in FIG. 26, the index slide 406 can move to the left so that the pawl 422 can engage one of the index drive pins 418 on the holder 470 and rotate the holder 470. In some embodiments, the index slide 406 can be connected to an index return spring 413 to allow the index slide 406 to move back to the non-index position, for example back to the right when the index driver 404 disengages from the index slide 406. With reference to the pawl 422, the pawl 422 can be movable around a pivot 425, and connected to a return spring 423, which allows the pawl 422 to pivot or otherwise move to a non-index position so as not to engage one of the index drive pins 418.

Figure 27:
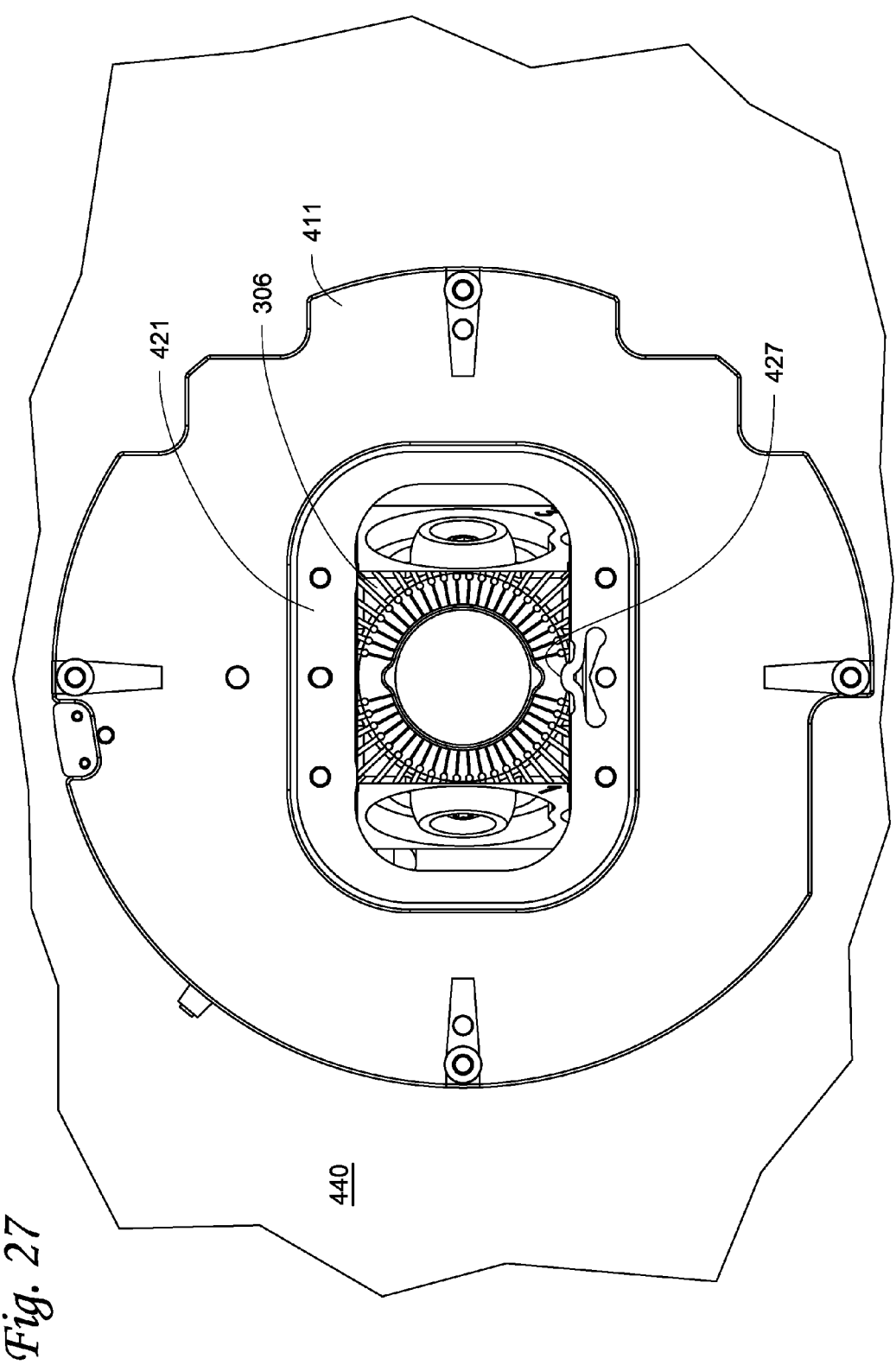
FIG. 27 is top plan section view of the testing system of FIG. 21.

The system 400 can also include a dock portion, such as for example docking block 402 and ports with seals, e.g. o-ring seals. The docking block 402 provides a pneumatic/pressure and electrical interface of the system 402, for example with the testing/measurement equipment. In the embodiment shown, the docking block 402 is on top of the top plate 401, and can have a clearance or recessed area to allow clearance for docking equipment, such as rods or other clamp structures. The docking block 402 can be pinched on sides so that the pressure and electrical connections can be made. The o-rings 403 allow seal for air to enter into the system, for example the air lift cylinder 408 and the air cylinder 417 of the index drive 404. The docking equipment delivers pressured air to the air cylinders and can also have electrical contacts to electrically contact the docking block 402, such as when a clamp engages or pinches the docking block 402. The electrical connection can be used for example to read the ID resistors In some embodiments, further alignment structures may be employed to help the probe card be placed into probing position. For example, an additional plate 421 as shown for example in FIGS. 23 and 27 may be disposed between the circuit board 440 and the lower plate 411. The plate 421 can be somewhat flexible to allow fit with the probe card when it is positioned onto the circuit board 440 and device to be tested. In some embodiments, the plate 421 can include a detent bump 427 that may be somewhat flexible and allow for example the notch structure 312 of probe card 300 to align and engage in the correct position. FIG. 27 shows a top plan view of the system 400 with much of the carriage and frame structures removed so that the plate 421 can be seen.

It will be appreciated that the system 400 on the circuit board 440 can also incorporate identification capability and resistance measurement, e.g. use identification resistors, in the same or similar manner as described above with respect to circuit board 40 and probe apparatuses 100 and 10. In one embodiment, resistor 452 may be used. Identification resistors on the circuit board 440 can allow for a determination to be made for example as to whether the correct circuit board is being used. As with the resistors on the probe card, it will be appreciated that standard test equipment may be used to read the resistors on the circuit board 440. In some embodiments, the circuit board 440 can include traces for temperature feedback similar to circuit 40 above. Such traces can be used for incorporating a temperature resistor/feedback capability.

Figure 28:
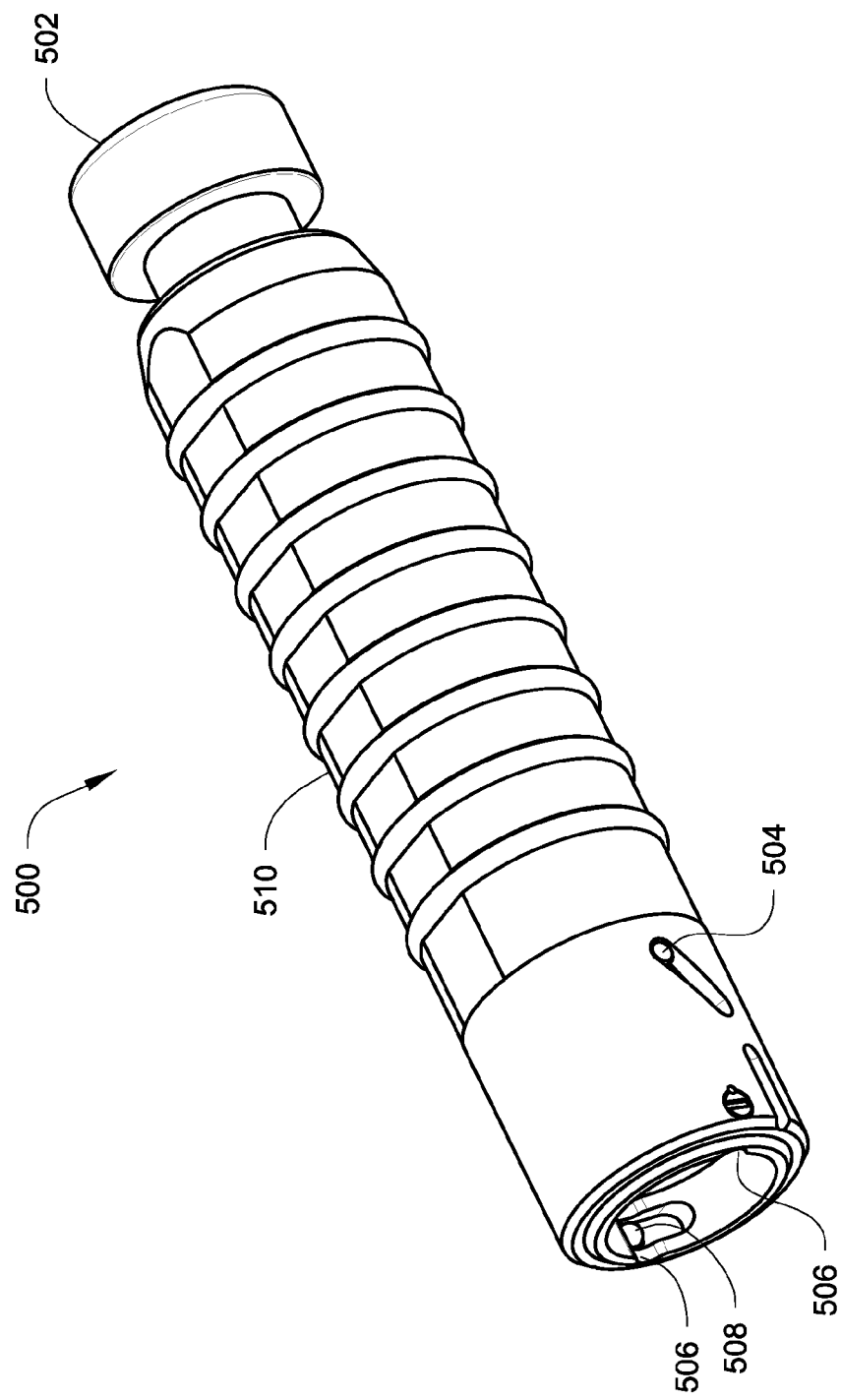
FIG. 28 is an isometric view of one embodiment of a loading tool.

FIG. 28 is one embodiment of a loading tool 500. The loading tool 500 can be useful to load and remove a probe card, e.g. 100, 300, from a holder, e.g. holder 470 and can avoid contact with the probe tips on the probe card and avoid the risk of particulate getting into the probe array. The loading tool 500 includes an actuator 502, such as a button, and includes a probe card engaging end. The probe card engaging end has an internal rod 504, notches 506, and an engaging member 508, such as a ball. The loading tool has a main body that can be a handle 510. In one embodiment, when the button or actuator 502 is up, the rod 504 is up which can rotate the ball into the slot (e.g. slot 304b of the probe card 300), thus retaining the probe card so it can be loaded onto a holder or removed from a holder (e.g. holder 470). When the button or actuator 502 is pushed down, the rod 504 is pushed down which rotates the ball out of the slot to liberate the probe card (e.g. slot 304b of probe card 300). Thus, by activating the actuator 502, e.g. pushing the button down or pushing the button to release it up, the loading tool 500 can disengage/engage the probe card. In some embodiments, the probe card engaging end can rotate when the button is pushed to move the engaging member 508.

Figure 29:
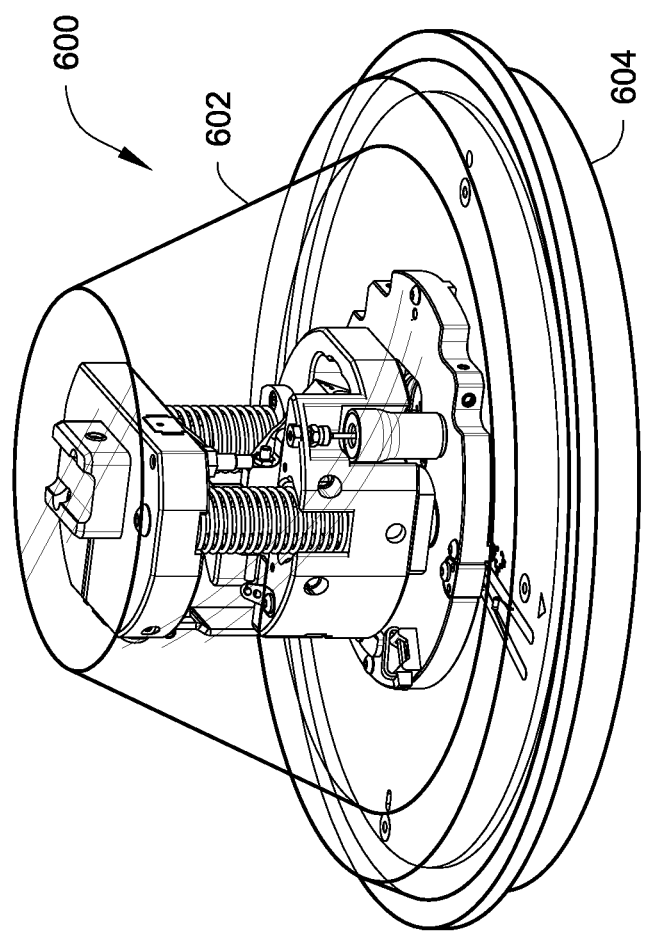
FIG. 29 is a perspective view of one embodiment of packaging for a testing system.

FIG. 29 is a perspective view of one embodiment of packaging 600 for a testing system. In some embodiments, the packaging 600 is plastic and has a lid 602 and base 604 in the form of a Tupperware-like container. The packaging 600 can be configured to contain for example the testing system 400 as a single unit, including for example the circuit board (e.g. 40) and carriage, holder, and carriage frame), and be shipped as multiple units.

FIGS. 15 and 16 are perspective views of one embodiment of translational indexing 200 of multiple probe apparatuses. As noted above, a holder may be configured to translate between probe cards. FIG. 15 shows one embodiment of such translational indexing. Different from a rotational indexer, such as holder 70, FIG. 15 shows a circuit board 400 for interchanging probe cards. For example, probe apparatus 100 may be employed as the probe cards in such a translational indexing implementation. Four interchangeable probe cards 100 are shown, but it will be appreciated that more or less than four probe cards may be employed.

In one embodiment, probe card 100 in the center of the circuit board 400, may be selected, moved and then dropped into the probing position. In one embodiment, an actuator or other movable component, can select a probe card 100, and then move and drop it into the probing position. Likewise, a probe card 100 in the probing position can be lifted and moved out of the probing position and, for example, replaced with a different probe card. FIG. 16 shows an example of a canter or actuator structure for moving the probe cards 100. In one embodiment, such a structure may be configured for example as an arm 210 that can select and move a probe card 100 as needed into and out of the probing position, and to replace a probe card 100.

It will be appreciated that switching from one probe to another can be configured as an automated process, where appropriate controlling, processing, and mechanical hardware are employed as necessary to manipulate the holder. It will also be appreciated that pneumatic operation of the holder can be employed so as to eliminate or at least reduce electrical interference with the operation of the probe card.

Figure 30:
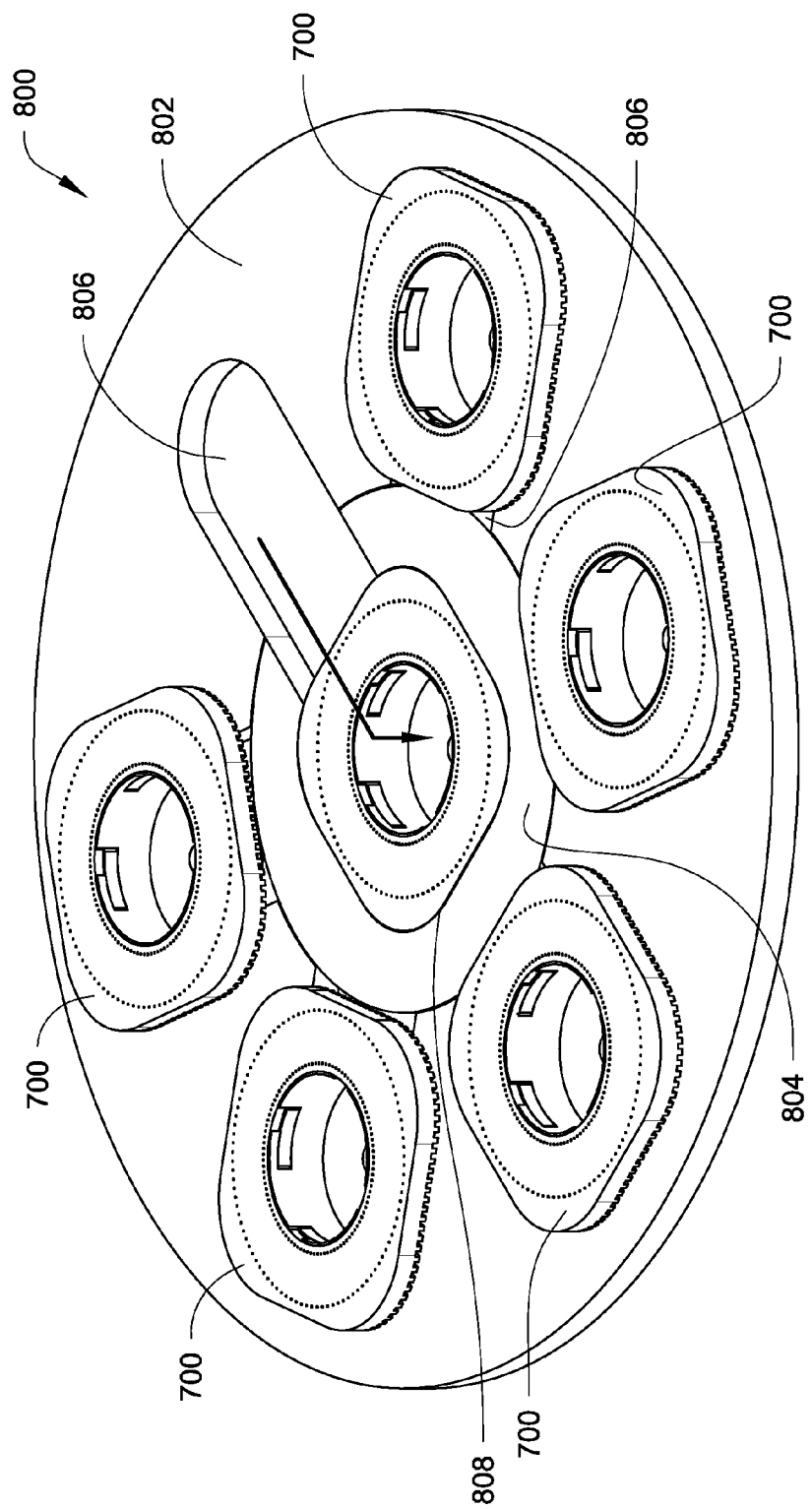
FIG. 30 is a top perspective view of another embodiment of translational indexing of multiple probe apparatuses.
Figure 31:
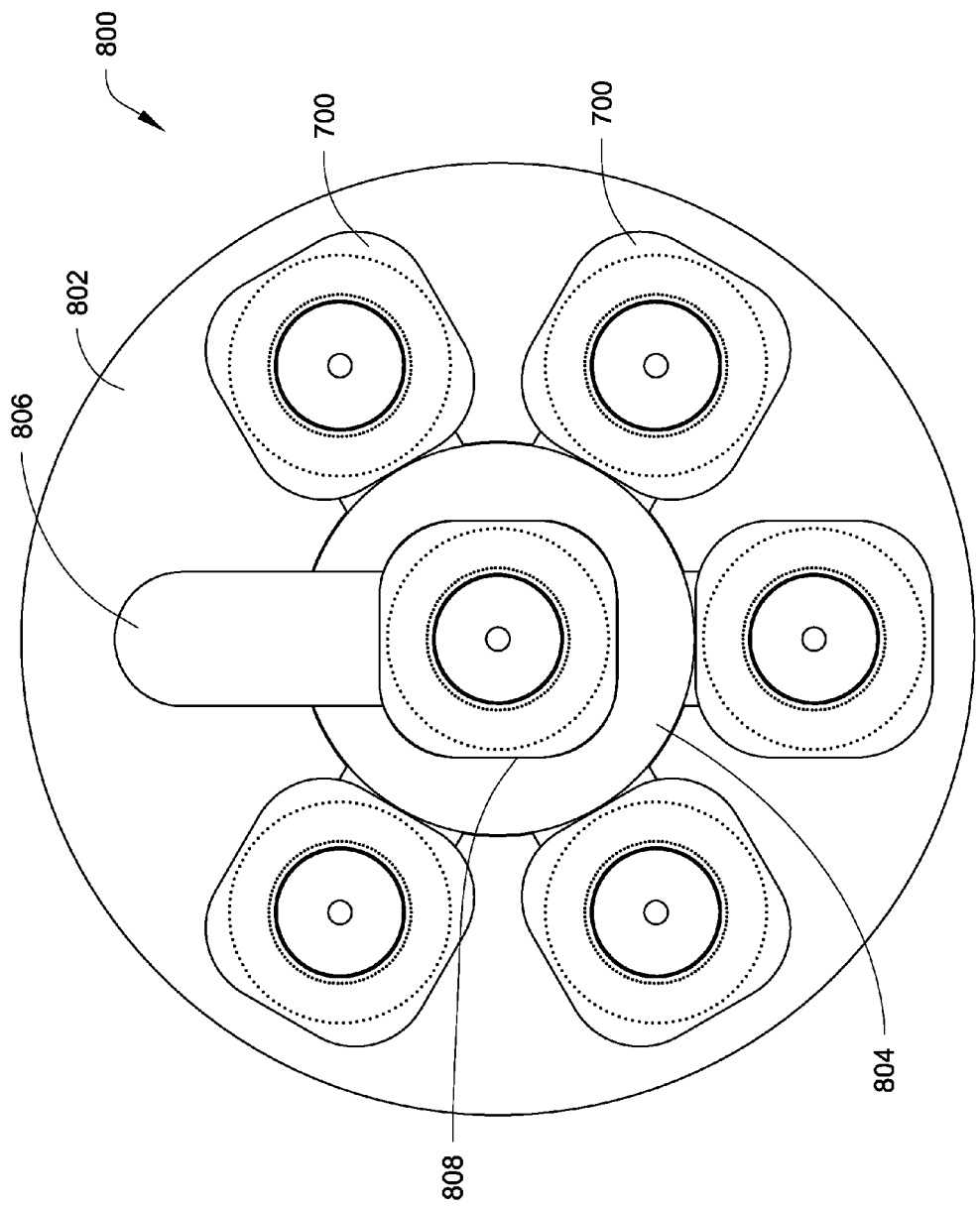
FIG. 31 is a top view of the translational indexing of multiple probe apparatuses shown in FIG. 30.
Figure 32:
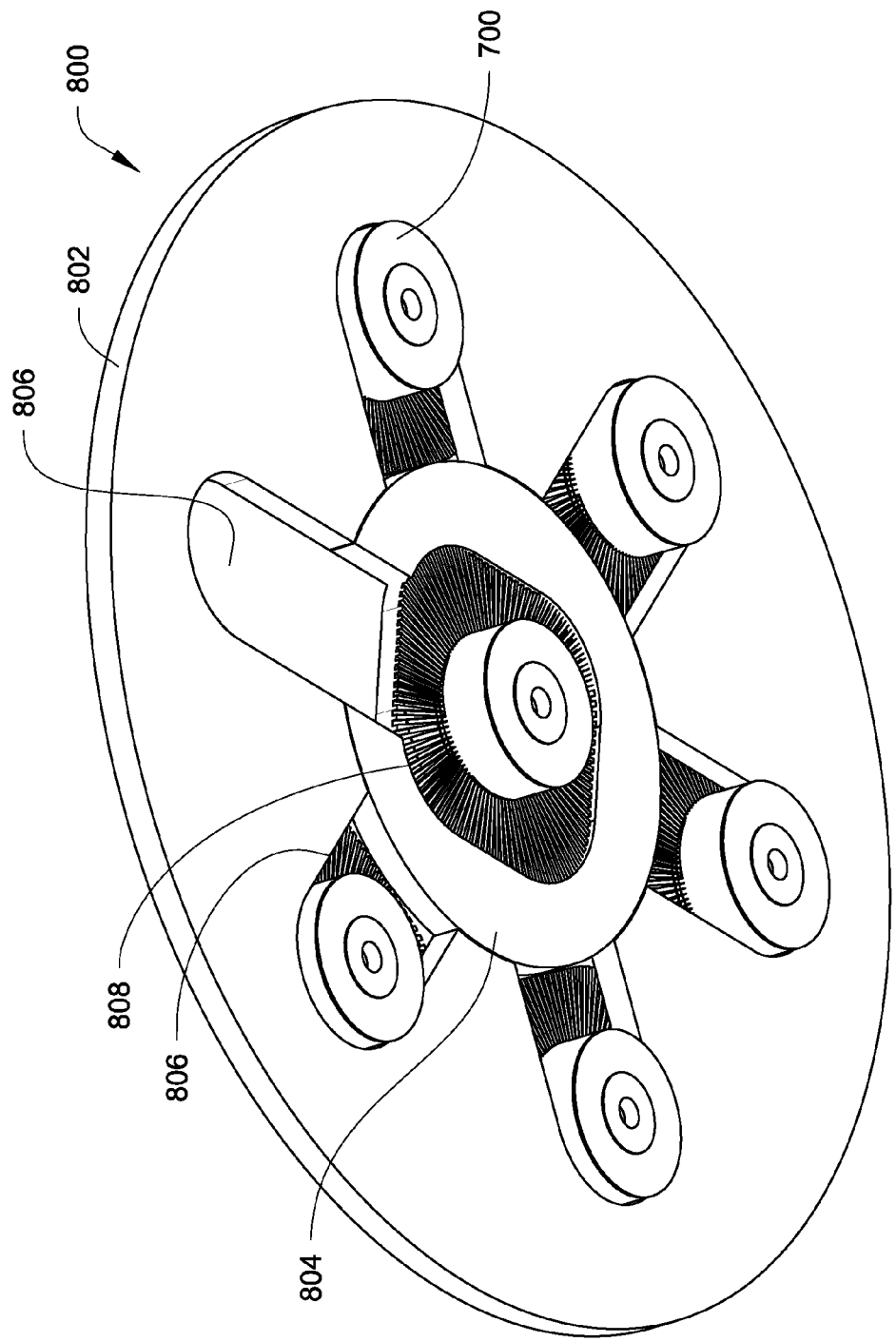
FIG. 32 is a bottom perspective view of the translational indexing of multiple probe cards shown in FIG. 30.

FIGS. 30 to 34 show another embodiment of translational indexing of multiple probe apparatuses. As noted above, a holder may be configured to translate between probe cards. FIGS. 30 to 32 show one embodiment of such translational indexing. Different from a rotational indexer, FIGS. 30 to 32 show a translational indexer 800 where the carriage structure is constructed as having multi-position plate 802 for interchanging probe cards within a center static plate 804. The multi-position plate 800 has locations with slots 806 for a probe card 700 to be arranged therein. The center plate 804 has a probe position 808 at which one of the probes 700 can be positioned. The center plate 804 has an entry that can communicate with the slots 806 (see arrow) to allow, for example, a probe card 700 to slide toward and down into the probe position 808 of the center plate 804. In some embodiments, the multi-position plate 802 can be rotatable relative to the center plate 804, or vice versa, to allow alignment of any one of the slots at one time with the entry into the probe position 808 of the center plate 804. It will be appreciated that either of the center plate 804 and multi-position plate 802 may be static relative to the other, or may both be rotatable to communicate the slot 806 and entry into the probe position 808. It will be appreciated suitable mechanical structures may be employed to engage the probe cards 700 as needed to slide them along the slot 806 into and out of the probe position 808.

Figure 33:
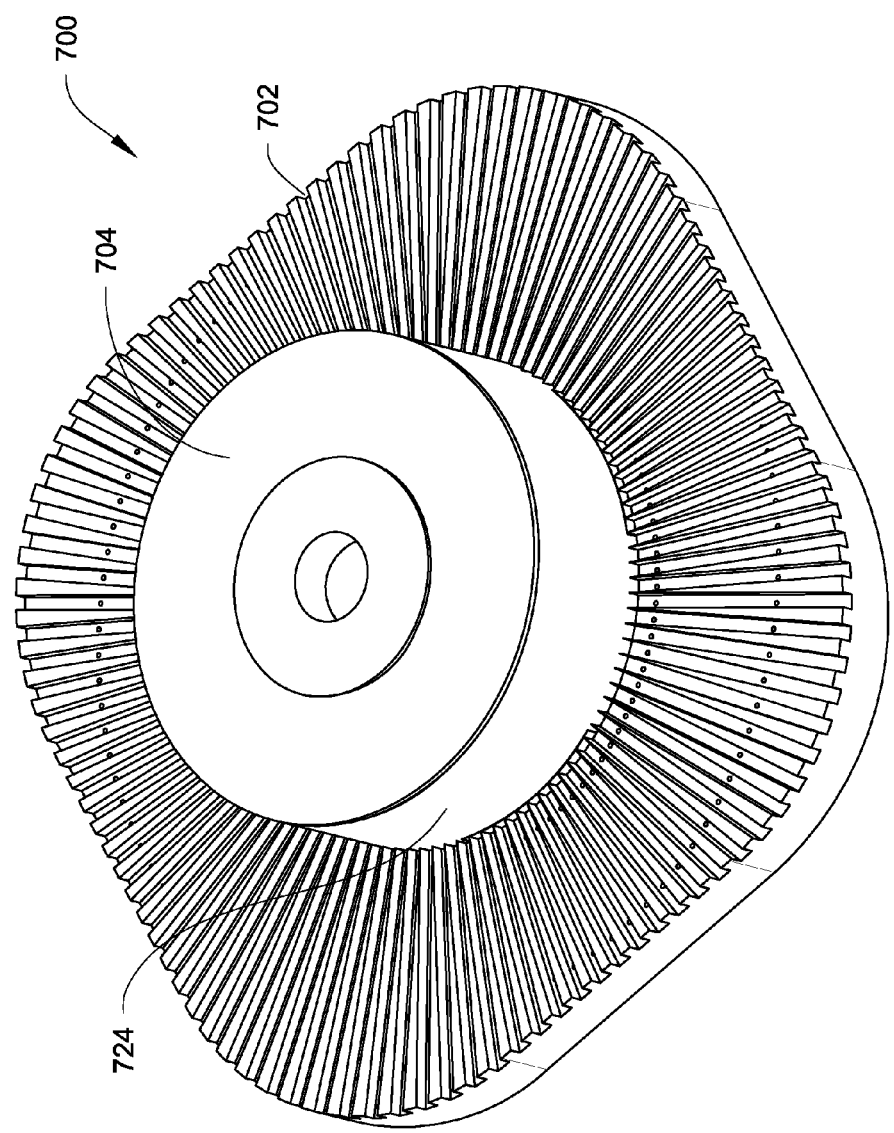
FIG. 33 is perspective view of the probe shown in FIG. 30.
Figure 34:
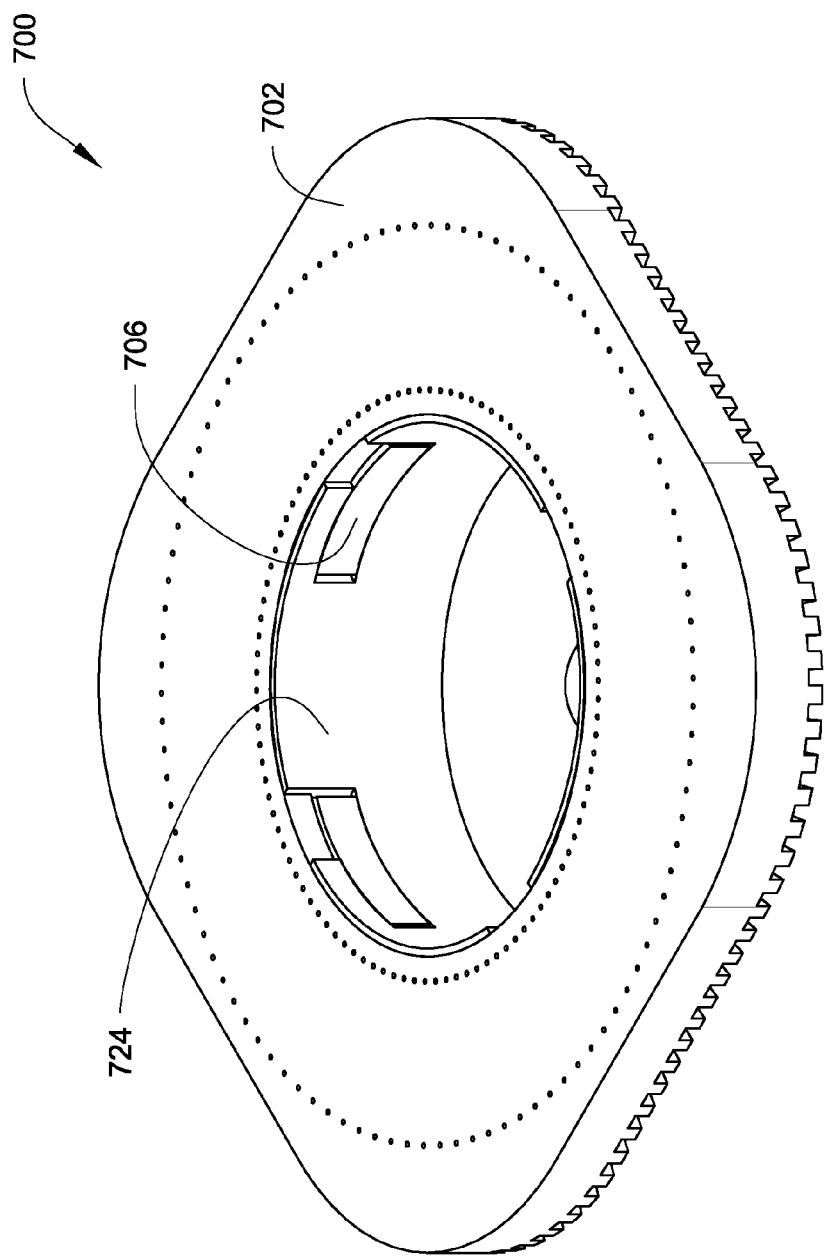
FIG. 34 is another perspective view of the probe shown in FIG. 30.

FIGS. 33 and 34 show an individual probe card 700 which is another embodiment of a probe card. As with the probe cards described earlier, probe card 700 has a wire guide 702 and a probe tile 704 held together by a chassis 724. The probe card 700 can also have a retainer structure 706, such as on the chassis 724 to allow for other test components, such as a suitable holder to engage the probe card 700 and position it as needed. In some embodiments, the retainer 706 can be a twist lock feature on annular surface of the chassis 724, which can be engaged by a suitably structured holder. It will be appreciated this configuration is merely exemplary.

It will be appreciated that switching from one probe to another can be configured as an automated process, where appropriate controlling, processing, and mechanical hardware are employed as necessary to manipulate the holder. It will also be appreciated that pneumatic operation of the holder can be employed so as to eliminate or at least reduce electrical interference with the operation of the probe card.

The numerous innovative teachings of the present application have been set forth above with particular reference to presently preferred but exemplary embodiments, wherein these innovative teachings are advantageously applied, for example to the particular problems of a probe needle for measuring low currents with a wide operating temperature range in probing a semiconductor device. However, it should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

The following terms have been particularly described throughout the description and are not intended to be limitative:

Semiconductor Device not Limitive

The present disclosure is particularly suitable for probing semiconductor devices, but the use of the present teachings is not limited to probing semiconductor devices. Other devices may be applied to the present invention teachings. Thus, while this specification speaks in terms of probing 'semiconductor' devices, this term should be interpreted broadly to include probing any suitable device.

Low Current not Limitive

The present disclosure can solve the problem of measuring currents below 100 fA, but the current range of the present teachings is not limited to below 100 fA. For example, the present invention may be applied to measure the currents at or above 100 fA in a semiconductor device. Thus, while this specification speaks in terms of 'low currents' or 'measuring currents below 100 fA', these terms should be interpreted broadly to include any current that flows through a semiconductor device which could be at or above 100 fA. In a grounded guard controlled impedance configuration the present invention also solves the problem of measuring high frequency signals at high temperatures.

Wide Temperature not Limitive

The present disclosure can solve the problem of measuring currents of a semiconductor device in a narrow or limited operating temperature range. The present teachings do not limit to a specific operating temperature range. The present application allows a tester to electrically probe semiconductor devices over a wide operating temperature range, not only at a low operating temperature but also a high operating temperature, e.g. an operating temperature up to 300° C. and beyond. Thus, while this specification speaks in terms of 'wide temperature range' or 'measuring currents in a wide operating temperature range', these terms should be interpreted broadly to include any suitable operating or testing temperature range of a semiconductor device.

Probe not Limitive

The present disclosure can solve the problem of measuring currents of a semiconductor device using a shielded probe, for example a co-axial shielded probe. However, nothing in the teachings of the present invention limits application of the teachings of the present invention to a probe needle with more or less layers if appropriate and/or desired. Advantageous use of the teachings herein may be had with a probe needle of any number of layers. Use of optical or RF signal devices can replace probe needles for signal acquisition.

Signal Contact/Cable and Guard Contact/Cable not Limitive

The present disclosure can solve the problem of measuring currents of a semiconductor device using a co-axial or a tri-axial signal cable. However, nothing in the teachings of herein limits application of the teachings of the present disclosure to a signal cable with more or less layers. Advantageous use of the teachings herein may be had with a signal cable of any number of layers.

Metals not Limitive

Throughout the discussion herein have been references to metals in regards to needle and driven guard. The present disclosure does not recognize any limitations in regards to what types of metals may be used in affecting the teachings herein. One skilled in the art will recognize that any conductive material may be used with no loss of generality in implementing the teachings of the present disclosure.

Dielectric not Limitive

Throughout the descriptions herein reference has been made to the term dielectric. The present disclosure does not recognize any limitations in regards to what types of dielectric may be used in affecting the teachings herein. One skilled in the art will recognize that any non-conductive, highly heat-resistant material may be used with no loss of generality in implementing the teachings of the present disclosure.

The embodiments disclosed in this application are to be considered in all respects as illustrative and not limitative. The scope of the invention is indicated by the appended claims rather than by the foregoing description; and all changes which come within the meaning and range of equivalency of the claims are intended to be embraced therein.

The invention claimed is:

1. A system for testing a device under test, comprising:
a circuit board having a pattern of signal contacts and a pattern of guard contacts, the circuit board is configured as a plate having a top side, a bottom side, and an opening through the top and bottom sides;
a probe card including a wire guide, a probe tile connected with the wire guide, a plurality of probe wires supported by the wire guide and probe tile, the probe wires are positioned through the wire guide and the probe tile, the probe wires include a probe tip extending through the probe tile, the probe tips forming an array to probe the device under test, the probe wires including a signal transmitting portion and a guard portion exposed from the wire guide, the signal transmitting portions and the guard portions form a contact pattern and, with the array, are disposed on one side of the probe card, and a retainer member is disposed on another side of the probe card;
a holder having multiple probe card stations, the probe card stations have a connector structure to connect to and disconnect from the retainer member of the probe card, and to allow the probe card to both contact the circuit board and the device under test; and
a carriage mechanism configured to position the probe card onto the circuit board, the carriage mechanism to position any of the probe card stations to allow connection to and disconnection from other probe cards, to interchange among the probe card and the other probe cards, and to position one or more of the other probe cards to contact the circuit board,
wherein the probe tile is insertable into the opening of the circuit board to allow the array to probe the device under test, and the contact pattern of the probe card is contactable with the pattern of signal contacts and guard contacts on the circuit board, such contact of the probe card with the circuit board allows signals to be transferred through the probe wires and circuit board.

2. The system of claim 1, wherein the retainer member includes a socket where the socket is configured to receive a ball mount.

3. The system of claim 1, wherein the holder includes at least five locations on which the probe card is mountable, and on which other probe cards are mountable.

4. The system of claim 3, wherein the holder is a pentagonal wheel having five faces, each of which is mountable for a probe card, the pentagonal wheel is configured to perform rotational indexing of the probe cards.

5. The system of claim 1, wherein the holder is configured to switch from one probe card to another through a pneumatic operation and an automatic control.

6. The system of claim 1, wherein the holder is configured to perform translational indexing of the probe cards.

7. The system of claim 1, wherein the carriage mechanism includes a frame and indexing components.

8. The system of claim 1, further comprising a loading tool to load and remove probe cards from the holder.

9. The system of claim 1, further comprising a packaging to contain the circuit board, holder, and carriage mechanism as a single unit.

10. A method of probing devices under test, comprising:
  positioning a holder into a probe position, which includes retaining a probe card on a side of the holder;
  positioning, using a carriage mechanism connected to the holder, the probe card onto a circuit board and onto a device under test, the circuit board having a pattern of signal contacts and a pattern of guard contacts, the probe card including a plurality of probe wires, the probe wires including a probe tip extending through a probe tile, the probe tips forming an array to probe the device under test, the probe wires including a signal transmitting portion and a guard portion exposed from a wire guide, the signal transmitting portions and the guard portions form a contact pattern and, with the array, are disposed on a side of the probe card that is different from the side retained to the holder;
  indexing, using the carriage mechanism, the probe card to make aligned contact of the contact pattern of the probe card with the pattern of signal contacts and the pattern of guard contacts, and to make contact of the array with the device under test;
  probing the device under test using the array; and
  transmitting signals through the array to a test equipment by way of contact of the probe card with the circuit board and of contact of the probe card with the device under test, which allows signals to be transferred through the probe wires and circuit board.

11. The method of claim 10, further comprising replacing the probe card with another probe card.

12. The method of claim 10, further comprising rotating the holder to switch to one of at least four other probe cards.

13. The method of claim 10, wherein the one or more of the steps of positioning the holder, positioning the probe card, and indexing the probe card being through a pneumatic operation and an automated control.

* * * * *